US009978587B2

(12) United States Patent
Shimamoto et al.

(10) Patent No.: US 9,978,587 B2
(45) Date of Patent: May 22, 2018

(54) METHOD OF MANUFACTURING SEMICONDUCTOR DEVICE INCLUDING FORMING A FILM CONTAINING A FIRST ELEMENT, A SECOND ELEMENT AND CARBON, SUBSTRATE PROCESSING APPARATUS, AND RECORDING MEDIUM

(71) Applicant: HITACHI KOKUSAI ELECTRIC INC., Tokyo (JP)

(72) Inventors: Satoshi Shimamoto, Toyama (JP); Yoshiro Hirose, Toyama (JP); Ryuji Yamamoto, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days. days.

(21) Appl. No.: 14/804,604

(22) Filed: Jul. 21, 2015

(65) Prior Publication Data

US 2016/0024659 A1 Jan. 28, 2016

(30) Foreign Application Priority Data

Jul. 23, 2014 (JP) .................................. 2014-149463

(51) Int. Cl.
*H01L 21/02* (2006.01)
*H01L 21/67* (2006.01)
(Continued)

(52) U.S. Cl.
CPC ...... *H01L 21/0228* (2013.01); *C23C 16/0272* (2013.01); *C23C 16/30* (2013.01);
(Continued)

(58) Field of Classification Search
CPC ......... H01L 21/02126; H01L 21/02129; H01L 21/02131; H01L 21/02134;
(Continued)

(56) References Cited

U.S. PATENT DOCUMENTS 8,329,599 B2 12/2012 Fukazawa et al.
2011/0079857 A1 4/2011 Lee et al.
(Continued)

FOREIGN PATENT DOCUMENTS

CN 101807524 A 8/2010
CN 103620745 A 3/2014
(Continued)

OTHER PUBLICATIONS

Japanese Office Action for JP2014-149463, dated Nov. 4, 2015, 3 pages (with English translation).
Office Action issued in corresponding CN application dated Jul. 14, 2017.

*Primary Examiner* — Charles Garber
*Assistant Examiner* — Brigitte Paterson
(74) *Attorney, Agent, or Firm* — Volpe and Koenig, P.C.

(57) ABSTRACT

A technique includes forming a film containing a first element, a second element and carbon on a substrate by performing a cycle a predetermined number of times. The cycle includes non-simultaneously performing supplying a first precursor having chemical bonds between the first elements to a substrate, supplying a second precursor having chemical bonds between the first element and carbon without having the chemical bonds between the first elements to the substrate, and supplying a first reactant containing the second element to the substrate.

14 Claims, 15 Drawing Sheets

(51) Int. Cl.
*C23C 16/02* (2006.01)
*C23C 16/30* (2006.01)
*C23C 16/455* (2006.01)

(52) U.S. Cl.
CPC ...... *C23C 16/45531* (2013.01); *H01L 21/022* (2013.01); *H01L 21/0214* (2013.01); *H01L 21/0234* (2013.01); *H01L 21/02129* (2013.01); *H01L 21/02167* (2013.01); *H01L 21/02211* (2013.01); *H01L 21/02304* (2013.01); *H01L 21/02321* (2013.01); *H01L 21/67017* (2013.01); *H01L 21/02274* (2013.01)

(58) Field of Classification Search
CPC ........... H01L 21/02137; H01L 21/0214; H01L 21/02167; H01L 21/0217
See application file for complete search history.

(56) References Cited

U.S. PATENT DOCUMENTS

| | | |
|---|---|---|
| 2012/0045905 A1 | 2/2012 | Akae et al. |
| 2013/0224964 A1 | 8/2013 | Fukazawa et al. |
| 2013/0319290 A1 | 12/2013 | Xiao et al. |
| 2015/0147891 A1* | 5/2015 | Sano ............... H01L 21/022 438/769 |

FOREIGN PATENT DOCUMENTS

| | | |
|---|---|---|
| JP | 2003276110 A | 9/2003 |
| JP | 2011-097017 A | 5/2011 |
| JP | 2014-013888 A | 1/2014 |

* cited by examiner

FIG. 16

|  | First precursor | | Second precursor |
| --- | --- | --- | --- |
|  | HCDS gas | TCDMDS gas | BTCSM gas |
| Si-Si bond | Yes | Yes | No |
| Si-C bond | No | Yes | Yes |
| Pyrolysis temperature | Middle | Low | High |
| Adsorptivity | High | High | Low |
| Deposition rate | High | Middle | Low |

METHOD OF MANUFACTURING SEMICONDUCTOR DEVICE INCLUDING FORMING A FILM CONTAINING A FIRST ELEMENT, A SECOND ELEMENT AND CARBON, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2014-149463, filed on Jul. 23, 2014, the entire contents of which are incorporated herein by reference.

TECHNICAL FIELD

The present disclosure relates to a method of manufacturing a semiconductor device, a substrate processing apparatus, and a recording medium.

BACKGROUND

As an example of processes of manufacturing a semiconductor device, a process of forming a film such as a nitride film, an oxide film or the like on a substrate is often carried out by supplying, e.g., a precursor containing silicon and a reactant such as a nitriding gas, an oxidizing gas or the like to the substrate.

In some cases, depending on the kinds of precursors, when performing the aforementioned film forming process, it may be difficult to improve a deposition rate, and then the productivity of a film forming process deteriorates.

SUMMARY

The present disclosure provides some embodiments of a technique capable of improving the productivity of a film forming process.

According to one embodiment of the present disclosure, there is provided a technique including forming a film containing a first element, a second element and carbon on a substrate by performing a cycle a predetermined number of times, wherein the cycle includes non-simultaneously performing supplying a first precursor having chemical bonds between the first elements to a substrate; supplying a second precursor having chemical bonds between the first element and carbon without having the chemical bonds between the first elements to the substrate; and supplying a first reactant containing the second element to the substrate.

BRIEF DESCRIPTION OF THE DRAWINGS

FIG. 16 is a view showing features of a HCDS gas, a TCDMDS gas and a BTCSM gas.

DETAILED DESCRIPTION

One Embodiment of the Present Disclosure

One embodiment of the present disclosure will now be described mainly with reference to FIGS. 1 to 3.

(1) Configuration of Substrate Processing Apparatus

Figure 1:
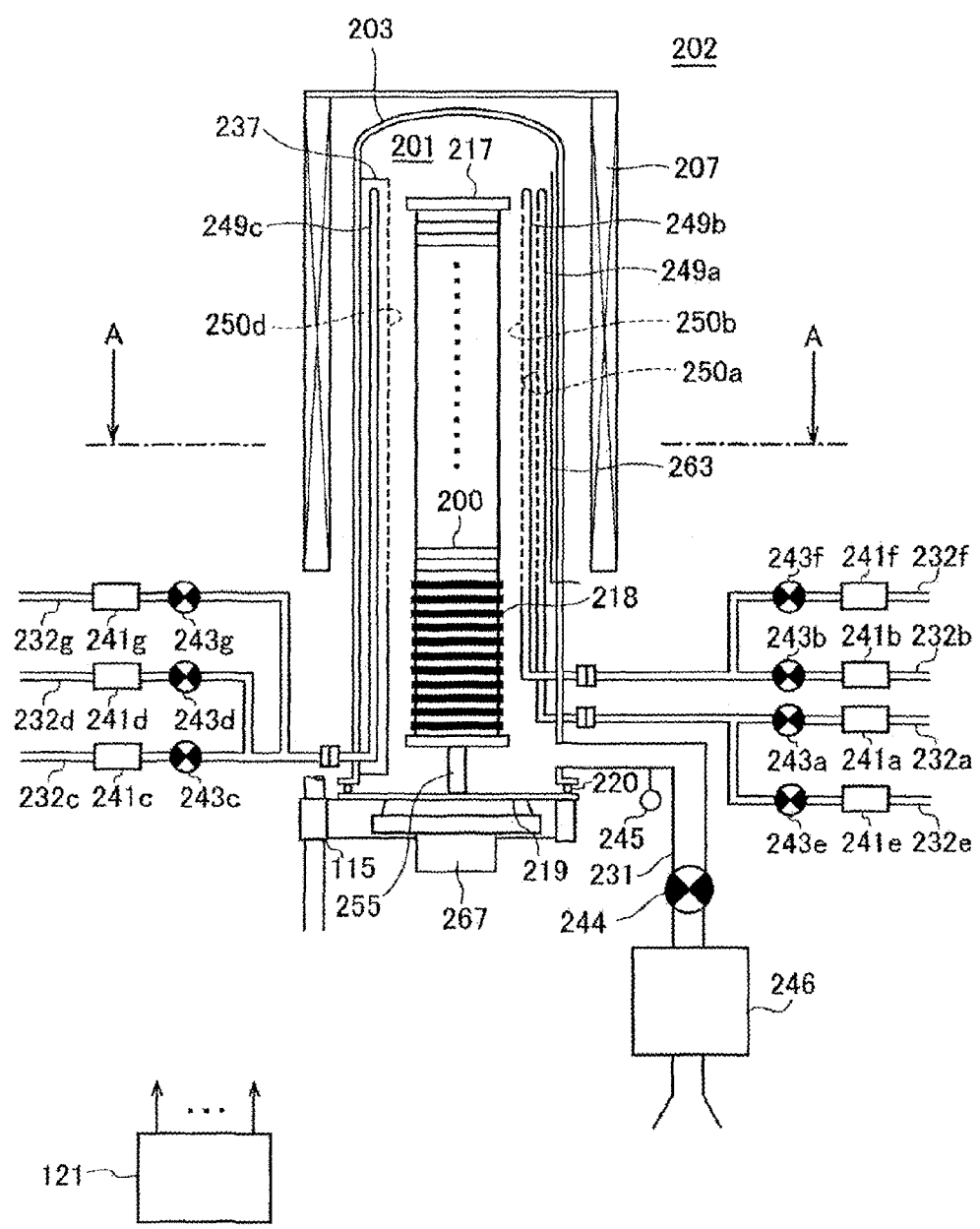
FIG. 1 is a schematic configuration view of a vertical processing furnace of a substrate processing apparatus suitably used in one embodiment of the present disclosure, in which a portion of the processing furnace is shown in a vertical cross section.

As shown in FIG. 1, a processing furnace 202 includes a heater 207 as a heating part (a heating mechanism). The heater 207 has a cylindrical shape and is supported by a heater base (not shown) serving as a support plate so as to be vertically installed. As will be described later, the heater 207 functions as an excitation part (an activation mechanism) configured to thermally excite (activate) a gas.

A reaction tube 203 constituting a reaction vessel (process vessel) is disposed inside the heater 207 in a concentric relationship with the heater 207. The reaction tube 203 is made of, e.g., a heat resistant material such as quartz ($SiO_2$), silicon carbide (SiC) or the like and has a cylindrical shape with its upper end closed and its lower end opened. A process chamber 201 is formed in a hollow cylindrical portion of the reaction tube 203. The process chamber 201 is configured to accommodate a plurality of wafers 200 as substrates. The wafers 200 are horizontally stacked at multiple stages along a vertical direction in a boat 217 which will be described later.

Nozzles 249a to 249c are installed in the process chamber 201 to penetrate through a lower portion of the reaction tube 203. The nozzles 249a to 249c are made of, e.g., a heat resistant material such as quartz, SiC or the like. Gas supply pipes 232a to 232c are respectively connected to the nozzles 249a to 249c. A gas supply pipe 232d is connected to the gas supply pipe 232c. In this way, the three nozzles 249a to 249c and the four gas supply pipes 232a to 232d are installed in the reaction tube 203 and are configured to supply plural kinds of gases into the process chamber 201.

However, the processing furnace 202 of the present embodiment is not limited to the configuration as described above. For example, a manifold made of metal and configured to support the reaction tube 203 may be installed under the reaction tube 203. Each of the nozzles may be installed to penetrate through a sidewall of the manifold. In this case, an exhaust pipe 231, which will be described later, may be further installed in the manifold. Alternatively, the exhaust pipe 231 may be installed in a lower portion of the reaction tube 203 rather than in the manifold. A furnace opening portion of the processing furnace 202 may be made of metal and the nozzles or the like may be installed in the metal-made furnace opening portion.

Mass flow controllers (MFC) 241a to 241d, which are flow rate controllers (flow rate control parts), and valves 243a to 243d, which are opening/closing valves, are sequentially installed in the gas supply pipes 232a to 232d from the corresponding upstream sides. Gas supply pipes 232e and 232g, which supply an inert gas, are respectively connected to the gas supply pipes 232a to 232c at the downstream side of the valves 243a to 243c. MFCs 241e to 241g, which are flow rate controllers (flow rate control parts), and valves 243e to 243g, which are opening/closing valves, are sequentially installed in the gas supply pipes 232e to 232g from the corresponding upstream sides.

The nozzles 249a and 249b are respectively connected to end portions of the gas supply pipes 232a and 232b. As shown in FIG. 2, the nozzles 249a and 249b are disposed in an annular space between the inner wall of the reaction tube 203 and the wafers 200 such that the nozzles 249a and 249b extend upward along an arrangement direction of the wafers 200 from a lower portion of the inner wall of the reaction tube 203 to an upper portion thereof. Specifically, the nozzles 249a and 249b are installed along a wafer arrangement region in which the wafers 200 are arranged and in a region that horizontally surrounds the wafer arrangement region at a side of the wafer arrangement region. That is to say, the nozzles 249a and 249b are installed in a perpendicular relationship with the surfaces (flat surfaces) of the wafers 200 at a lateral side of the end portions (peripheral edge portions) of the wafers 200 carried into the process chamber 201. Each of the nozzles 249a and 249b is configured as an L-shaped nozzle. A horizontal portion of each of the nozzles 249a and 249b is installed to penetrate a lower sidewall of the reaction tube 203. A vertical portion of each of the nozzles 249a and 249b is installed to extend upward at least from one end portion of the wafer arrangement region toward the other end portion thereof. A plurality of gas supply holes 250a and 250b for supplying gas is respectively formed on the side surfaces of the nozzles 249a and 249b. Each of the gas supply holes 250a and 250b is opened toward the center of the reaction tube 203 to allow the gas to be supplied toward the wafers 200. The gas supply holes 250a and 250b may be formed in a plural number so as to span from the lower portion of the reaction tube 203 to the upper portion thereof. The respective gas supply holes 250a and 250b may have the same opening area. Further, the gas supply holes 250a and 250b may be formed at a predetermined opening pitch.

The nozzle 249c is connected to an end portion of the gas supply pipe 232c. The nozzle 249c is installed within a buffer chamber 237 as a gas supply part. The buffer chamber 237 serves also as a gas distribution space. The buffer chamber 237 is installed in an annular space defined between the inner wall of the reaction tube 203 and the wafers 200 and in a region spanning from the lower portion of the inner wall of the reaction tube 203 to the upper portion thereof, so as to extend along the arrangement direction of the wafers 200. That is to say, the buffer chamber 237 is installed in a lateral side of a wafer arrangement region horizontally surrounding the wafer arrangement region, so as to extend along the wafer arrangement region. In other words, the buffer chamber 237 is installed at the lateral side of the end portions of the wafers 200 carried into the process chamber 201. Gas supply holes 250d configured to supply a gas is formed in the end portion of the wall of the buffer chamber 237 adjoining the wafers 200. The gas supply holes 250d are opened toward the center of the reaction tube 203 and are configured to supply a gas toward the wafers 200. The gas supply holes 250d are formed in a plural number so as to span from the lower portion of the reaction tube 203 to the upper portion thereof. The respective gas supply holes 250e have the same opening area and are formed at a regular opening pitch.

The nozzle 249c is installed at the opposite end portion of the buffer chamber 237 from the end portion in which the gas supply holes 250d are formed, so as to extend upward in the arrangement direction of the wafers 200 from the lower portion of the inner wall of the reaction tube 203 to the upper portion thereof. Specifically, the nozzle 249c is installed along the wafer arrangement region in which the wafers 200 are arranged and in a region that horizontally surrounds the wafer arrangement region. In other words, the nozzle 249c is installed in a perpendicular relationship with the surfaces of the wafers 200 at a lateral side of end portions of the wafers 200 carried into the process chamber 201. The nozzle 249c is configured as an L-shaped nozzle. A horizontal portion of the nozzle 249c is installed to penetrate a lower sidewall of the reaction tube 203. A vertical portion of the nozzle 249c is installed to extend upward at least from one end portion of the wafer arrangement region toward the other end portion thereof. A plurality of gas supply holes 250c for supplying gas is formed on the side surface of the nozzle 249c. The gas supply holes 250c are opened toward the center of the buffer chamber 237. Similar to the gas supply holes 250d, the gas supply holes 250c are formed in a plural number so as to span from the lower portion of the reaction tube 203 to the upper portion thereof. If a pressure difference between an interior of the buffer chamber 237 and an interior of the process chamber 201 is small, the gas supply holes 250c may be configured to have the same opening area. Further, the gas supply holes 250e may be formed at a predetermined opening pitch from an upstream side (i.e., a lower portion) to a downstream side (i.e., an upper portion). In contrast, if the pressure difference between the interior of the buffer chamber 237 and the interior of the process chamber 201 is large, the opening area of the gas supply holes 250c may be set to become gradually larger from the upstream side toward the downstream side. Alternatively or additionally, the opening pitch of the gas supply holes 250c may be set to become gradually smaller from the upstream side toward the downstream side.

By adjusting the opening area and the opening pitch of the gas supply holes 250c from the upstream side to the downstream side as described above, a gas may be injected from the respective gas supply holes 250c substantially at the same flow rate but at different flow velocities. The gas injected from the individual gas supply holes 250c is first introduced into the buffer chamber 237. This makes it possible to make uniform the flow velocities of the gas within the buffer chamber 237. The particle velocity of the gas injected from the respective gas supply holes 250c into the buffer chamber 237 are reduced in the buffer chamber 237. Then, the gas is injected from the respective gas supply holes 250d into the process chamber 201. The gas which has flown into the buffer chamber 237 from the respective gas supply holes 250c has a uniform flow rate and a uniform flow velocity when ejected from the respective gas supply holes 250d into the process chamber 201.

As described above, in the present embodiment, a gas is transferred through the nozzles 249a to 249c, which are disposed in the vertically-elongated annular space, i.e., a cylindrical space, defined by the inner surface of the side wall of the reaction tube 203 and the end portions (peripheral edge portions) of the wafers 200 arranged within the reaction tube 203, and the buffer chamber 237. The gas is initially injected into the reaction tube 203, near the wafers 200, through the gas supply holes 250a to 250d formed in the nozzles 249a to 249c and the buffer chamber 237. Accordingly, the gas supplied into the reaction tube 203 mainly flows within the reaction tube 203 in a direction parallel to surfaces of the wafers 200, i.e., in a horizontal direction. With this configuration, the gas can be uniformly supplied to the respective wafers 200. This makes a thickness of a thin film formed on each of the wafers 200 uniform. In addition, the gas flowing on the surfaces of the wafers 200 after reaction, i.e., the reacted residual gas, flows toward an exhaust port, i.e., the exhaust pipe 231 which will be described later. The flow direction of the residual gas is not limited to a vertical direction but may be appropriately decided depending on a position of the exhaust port.

A first precursor having a chemical bond between the first elements, for example, a halosilane precursor gas including silicon (Si) as the first element and a halogen element and having a chemical bond between Si atoms (a Si—Si bond), is supplied from the gas supply pipe 232a into the process chamber 201 via the MFC 241a, the valve 243a and the nozzle 249a.

The halosilane precursor gas refers to a gaseous halosilane precursor, for example, a gas obtained by vaporizing a halosilane precursor which remains in a liquid state under a room temperature and an atmospheric pressure, or a halosilane precursor which remains in a gas state under a room temperature and an atmospheric pressure. The halosilane precursor refers to a silane precursor having a halogen group. Examples of the halogen group may include a chloro group, a fluoro group, a bromo group and an iodine group. That is to say, the halogen group includes a halogen element such as chlorine (Cl), fluorine (F), bromine (Br), iodine (I) or the like. The halosilane precursor may be said to be one kind of halide. When the term "precursor" is used herein, it may refer to "a liquid precursor staying in a liquid state," "a precursor gas staying in a gaseous state," or both.

As the halosilane precursor gas, it may be possible to use, e.g., a precursor gas containing Si and Cl, namely a chlorosilane precursor gas. As the chlorosilane precursor gas, it may be possible to use, e.g., a hexachlorodisilane ($Si_2Cl_6$, abbreviation: HCDS) gas.

In the case of using a liquid precursor, such as HCDS or the like, which stays in a liquid state under a room temperature and an atmospheric pressure, the liquid precursor is vaporized by a vaporization system such as a vaporizer or a bubbler and is supplied as a first precursor gas (HCDS gas).

Furthermore, a first precursor having a chemical bond between the first elements and a chemical bond between the first element and carbon (C), for example, an alkyl halosilane precursor gas including Si as the first element, an alkyl group and a halogen group and having a Si—Si bind and a chemical bond between Si and C (a Si—C bond), is supplied from the gas supply pipe 232a into the process chamber 201 via the MFC 241a, the valve 243a and the nozzle 249a.

The alkyl halosilane precursor gas refers to a gaseous alkyl halosilane precursor, for example, a gas obtained by vaporizing an alkyl halosilane precursor which remains in a liquid state under a room temperature and an atmospheric pressure, or an alkyl halosilane precursor which remains in a gas state under a room temperature and an atmospheric pressure. The alkyl group is a functional group obtained by removing one H atom from chain-shaped saturated hydrocarbon represented by a chemical formula C—$H_{2n+2}$ and is an aggregate of atoms represented by a chemical formula C—$H_{2n+1}$. The alkyl group includes a methyl group, an ethyl group, a propyl group, an isopropyl group, a butyl group, an isobutyl group and so forth. Similar to the aforementioned halosilane precursor gas, the halogen group includes a chloro group, a fluoro group, a bromo group, an iodine group and so forth. That is to say, the halogen group includes a halogen element such as Cl, F, Br, I or the like.

As the alkyl halosilane precursor gas, it may be possible to use, e.g., a precursor gas containing Si, a methyl group (—$CH_3$) as an alkyl group and a chloro group (Cl) as a halogen group, namely a chlorosilane precursor gas containing a methyl group. As the chlorosilane precursor gas containing a methyl group, it may be possible to use, e.g., a 1,1,2,2-tetrachloro-1,2-dimethyldisilane (($CH_3)_2Si_2Cl_4$, abbreviation: TCDMDS) gas, a 1,2-dichloro-1,1,2,2-tetramethyldisilane (($CH_3)_4Si_2Cl_2$, abbreviation: DCTMDS) gas, a 1-monochloro-1,1,2,2,2-pentamethyldisilane (($CH_3)_5Si_2Cl$, abbreviation: MCPMDS) gas, or the like.

Figure 12A:
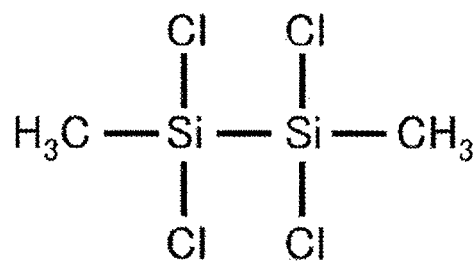
FIG. 12A is a view illustrating a chemical structural formula of TCDMDS.

As shown in FIG. 12A, TCDMDS contains two methyl groups as alkyl groups in one molecule. Each of dangling bonds of the two methyl groups is bonded to Si such that Si—C bonds are formed. TCDMDS is a derivative of disilane, and has a Si—Si bond. As such, TCDMDS has a Si—Si—C bond in which Si and Si are bonded to each other, and Si is bonded to C.

Figure 12B:
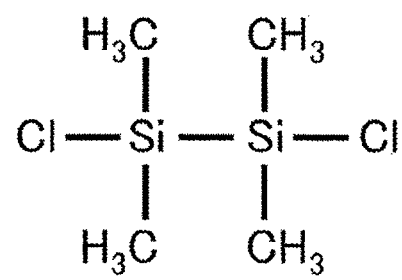
FIG. 12B is a view illustrating a chemical structural formula of DCTMDS.

As shown in FIG. 12B, DCTMDS contains four methyl groups as alkyl groups in one molecule. Each of dangling bonds of the four methyl groups is bonded to Si, such that Si—C bonds are formed. DCTMDS is a derivative of disilane, and has a Si—Si bond. As such, DCTMDS has a Si—Si—C bond in which Si and Si are bonded to each other, and Si is bonded to C.

Figure 12C:
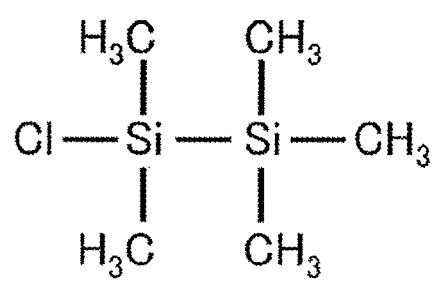
FIG. 12C is a view illustrating a chemical structural formula of MCP-MDS.

As shown in FIG. 12C, MCPMDS contains five methyl groups as alkyl groups in one molecule. Each of dangling bonds of the five methyl groups is bonded to Si, such that Si—C bonds are formed. MCPMDS is a derivative of disilane, and has a Si—Si bond. As such, MCPMDS has a Si—Si—C bond in which Si and Si are bonded to each other, and Si is bonded to C. Unlike TCDMDS and DCTMDS, MCPMDS has an asymmetry structure in which the methyl groups and the chloro groups surrounding Si are asymmetrically arranged in one molecule (in the chemical structural formula). As described above, in the present embodiment, it may be possible to use a precursor having an asymmetric chemical structural formula in addition to a precursor having a symmetric chemical structural formula.

The alkyl halosilane precursor gas such as the TCDMDS gas, the DCTMDS gas, or the MCPMDS gas may be a precursor gas which contains at least two Si atoms in one molecule, contains C and Cl, and has a Si—Si bond and Si—C bonds. In a substrate processing process which will be described later, this gas acts as a Si source and a C source unlike the aforementioned halosilane precursor gas. The TCDMDS gas, the DCTMDS gas, or the MCPMDS gas may be referred to as an alkyl chlorosilane precursor gas.

In the case of using a liquid precursor, such as TCDMDS or the like, which stays in a liquid state under a room temperature and an atmospheric pressure, the liquid precursor is vaporized by a vaporization system such as a vaporizer or a bubbler and is supplied as a first precursor gas (TCDMDS gas).

A second precursor which does not have a chemical bond between the first elements and which has a chemical bond between the first element and carbon (C), for example, an alkylene halosilane precursor gas which contains Si as the first element, an alkylene group and a halogen group and which has a Si—C bond, is supplied from the gas supply pipe 232b into the process chamber 201 via the MFC 241b, the valve 243b and the nozzle 249b.

The alkylene halosilane precursor gas refers to a gaseous alkylene halosilane precursor, for example, a gas obtained by vaporizing an alkylene halosilane precursor which remains in a liquid state under a room temperature and an atmospheric pressure, or an alkylene halosilane precursor which remains in a gas state under a room temperature and an atmospheric pressure. The alkylene group is a functional group obtained by removing two hydrogen (H) atoms from chain-shaped saturated hydrocarbon (alkane), which is denoted as a chemical formula $C_nH_{2n+2}$ and is an aggregate of atoms that are denoted as a chemical formula $C_nH_{2n}$. The alkylene group includes a methylene group, an ethylene group, a propylene group, a butylene group, and so forth. Similar to the first precursor, the halogen group includes a chloro group, a fluoro group, a bromo group, an iodine group, or the like. As such, the halogen group includes a halogen element such as Cl, F, Br, I or the like.

As the alkylene halosilane precursor gas, it may be possible to use, e.g., a precursor gas containing Si, a methylene group (—$CH_2$—) as an alkylene group and a chloro group (Cl) as a halogen group, namely a chlorosilane precursor gas containing a methylene group, or a precursor gas containing Si, an ethylene group (—$C_2H_4$—) as an alkylene group and a chloro group (Cl) as a halogen group, namely a chlorosilane precursor gas containing an ethylene group. As the chlorosilane precursor gas containing a methylene group, it may be possible to use, e.g., a methylene bis(trichlorosilane) gas, namely a bis(trichlorosilyl)methane (($SiCl_3)_2CH_2$, abbreviation: BTCSM) gas. As the chlorosilane precursor gas containing an ethylene group, it may be possible to use, e.g., an ethylene bis(trichlorosilane) gas, namely a 1,2-bis(trichlorosilyl)ethane (($SiCl_3)_2C_2H_4$, abbreviation: BTCSE) gas.

Figure 11A:
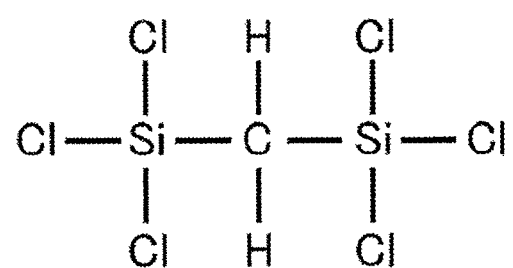
FIG. 11A is a view illustrating a chemical structural formula of BTCSM.

As shown in FIG. 11A, BTCSM contains one methylene group as an alkylene group in its chemical structural formula (in one molecule). Each of two bonds of the methylene group is bonded to Si such that a Si—C—Si bond is formed.

Figure 11B:
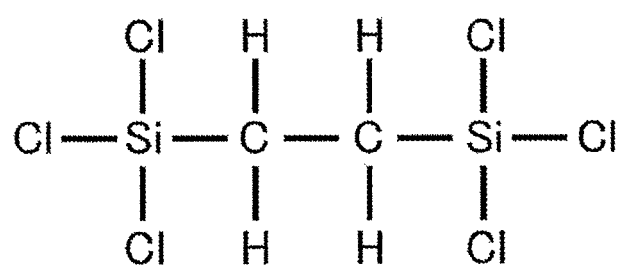
FIG. 11B is a view illustrating a chemical structural formula of BTCSE.

As shown in FIG. 11B, BTCSE contains one ethylene group as an alkylene group in one molecule. Each of two dangling bonds of the ethylene group is bonded to Si such that a Si—C—C—Si bond is formed.

The alkylene halosilane precursor gas such as the BTCSM gas or the BTCSE gas may be a precursor gas which contains at least two Si atoms in one molecule, contains C and Cl, and has Si—C bonds. In a substrate processing process which will be described later, this gas acts as a Si source and a C source just like the aforementioned alkyl halosilane precursor gas. The BTCSM gas or the BTCSE gas may be referred to as an alkylene chlorosilane precursor gas.

In the case of using a liquid precursor, such as BTCSM or the like, which stays in a liquid state under a room temperature and an atmospheric pressure, the liquid precursor is vaporized by a vaporization system, such as a vaporizer or a bubbler, and is supplied as a second precursor gas (a BTCSM gas or the like).

As compared with the first precursor gas, such as a HCDS gas or a TCDMDS gas, which has a Si—Si bond, the second precursor gas, such as a BTCSM or the like, which does not have a Si—Si bond and has a Si—C bond, exhibits a characteristic that makes it difficult for the second precursor gas to be adsorbed to a film formation base. Presumably, this is because the Si—C bond is stronger than the Si—Si bond and is hardly broken. In the second precursor gas not having the Si—Si bond, the portion of the Si—C bond is relatively difficult to be broken. Thus, the second precursor gas is more difficult to be decomposed than the first precursor gas having the Si—Si bond. It is presumed that the second precursor gas exhibits a characteristic that makes it difficult for the second precursor gas to be adsorbed to a film formation base. Due to this difference in characteristic, when film formation is performed using the second precursor gas such as a BTCSM or the like, a film formation delay called an incubation time tends to more easily occur than when film formation is performed using the first precursor gas such as a HCDS gas or a TCDMDS gas.

FIG. 16 illustrates relative features of a HCDS gas, a TCDMDS gas and a BTCSM gas. The HCDS gas is lower in pyrolysis temperature than the BTCSM gas and has a characteristic that the HCDS is more easily adsorbed to a film formation base than the BTCSM gas. When the HCDS gas is used as a film formation precursor, there is a tendency that the deposition rate becomes highest. The TCDMDS gas is lowest in pyrolysis temperature and has a characteristic that the TCDMDS gas is more easily adsorbed to a film formation base than the BTCSM gas. When the TCDMDS gas is used as a film formation precursor, there is a tendency that the deposition rate becomes higher than when the BTCSM gas is used. The BTCSM gas is highest in pyrolysis temperature and has a characteristic that the BTCSM gas is more difficult to be adsorbed to a film formation base than the HCDS gas or the TCDMDS gas. When the BTCSM gas is used as a film formation precursor, there is a tendency that the deposition rate becomes lowest.

A reactant containing elements (a second element and a third element) differing from the aforementioned first element, for example, a nitrogen (N)-containing gas as a reaction gas, is supplied from the gas supply pipe 232c into the process chamber 201 via the MFC 241c, the valve 243c, the nozzle 249c and the buffer chamber 237. As the N-containing gas, it may be possible to use, e.g., a hydrogen nitride-based gas. The hydrogen nitride-based gas may be referred to as a substance consisting of only two elements N and H. In a substrate processing process which will be described later, the N-containing gas acts as a nitriding gas, namely an N source. As the hydrogen nitride-based gas, it may be possible to use, e.g., an ammonia ($NH_3$) gas.

Alternatively, a reactant containing elements (a second element and a third element) differing from the aforementioned first element, for example, an oxygen (O)-containing gas as a reaction gas, may be supplied from the gas supply pipe 232c into the process chamber 201 via the MFC 241c, the valve 243c, the nozzle 249c and the buffer chamber 237. In a substrate processing process which will be described later, the O-containing gas acts as an oxidizing gas, namely an O source. As the O-containing gas, it may be possible to use, e.g., an oxygen ($O_2$) gas.

Further alternatively, a reactant containing elements (a second element and a third element) differing from the aforementioned first element, for example, a nitrogen (N)- and carbon (C)-containing gas as a reaction gas, may be supplied from the gas supply pipe 232c into the process chamber 201 via the MFC 241c, the valve 243c, the nozzle 249c and the buffer chamber 237. As the N- and C-containing gas, it may be possible to use, e.g., an amine-based gas.

The amine-based gas is a gaseous amine gas, e.g., a gas which is obtained by vaporizing amine which is in a liquid state under room temperature and atmospheric pressure or a gas which contains an amine group such as amine or the like staying in a gaseous state under room temperature and atmospheric pressure. The amine-based gas contains amine such as ethylamine, methylamine, propylamine, isopropylamine, butylamine, isobutylamine, or the like. As used herein, the term "amine" is a generic name of compounds in which a hydrogen atom (H) of ammonia ($NH_3$) is substituted with a hydrocarbon group such as an alkyl group or the like. Amine contains a hydrocarbon group such as an alkyl group or the like as a ligand containing C atoms, namely an organic ligand. The amine-based gas may be referred to as a Si-free gas since it contains three elements C, N, and H while not containing Si. The amine-based gas may be referred to as a Si-free and metal-free gas since it does not contain Si and metal. The amine-based gas may be a substance consisting of only three elements C, N and H. The amine-based gas acts as an N source and as a C source in a substrate processing procedure, which will be described later. The term "amine" as used herein refers to "amine in a liquid state," an "amine-based gas in a gaseous state," or both.

As the amine-based gas, it may be possible to use, e.g., a triethylamine (($C_2H_5$)$_3$N, abbreviation: TEA) gas, in which the number of C-containing ligands (ethyl groups) in the chemical structural formula (in one molecule) is two or more and the number of C atoms in one molecule is larger than the number of N atoms. In the case of using amine such as TEA or the like which is in a liquid state under room temperature and atmospheric pressure, the amine in a liquid state is vaporized by a vaporization system such as a vaporizer or a bubbler, and is supplied as an amine-based gas (a TEA gas).

Furthermore, a reactant containing elements (a second element and a third element) differing from the aforementioned first element, for example, a borazine-ring-skeleton-free boron (B)-containing gas as a reaction gas, may be supplied from the gas supply pipe 232c into the process chamber 201 via the MFC 241c, the valve 243c, the nozzle 249c and the buffer chamber 237. As the borazine-ring-skeleton-free B-containing gas, it may be possible to use, e.g., a borane-based gas.

The borane-based gas refers to a borane compound in a gaseous state, e.g., a gas obtained by vaporizing a borane compound in a liquid state under room temperature and atmospheric pressure, a borane compound in a gaseous state under room temperature and atmospheric pressure, or the like. The borane compound includes a haloborane compound containing B and a halogen element, e.g., a chloroborane compound containing B and Cl. Further, the borane compound includes borane (borohydride) such as monoborane ($BH_3$), diborane ($B_2H_6$) or the like, or a borane compound (borane derivative) in which H of borane is substituted with another element or the like. The borane-based gas acts as a B source in a substrate processing procedure, which will be described later. As the borane-based gas, it may be possible to use, e.g., a trichloroborane ($BCl_3$) gas. The $BCl_3$ gas is a borazine-ring-skeleton-free B-containing gas, namely a non-borazine-based B-containing gas.

In addition, a reactant containing elements (a second element and a third element) differing from the aforementioned first element, for example, a borazine-ring-skeleton-containing gas as a reaction gas, may be supplied from the gas supply pipe 232c into the process chamber 201 via the MFC 241c, the valve 243c, the nozzle 249c and the buffer chamber 237. As the borazine-ring-skeleton-containing gas, it may be possible to use, e.g., a gas containing a borazine ring skeleton and an organic ligand, namely an organic borazine-based gas.

As the organic borazine-based gas, it may be possible to use, e.g., a gas obtained by vaporizing an alkyl borazine compound which is an organic borazine compound. The organic borazine-based gas may be referred to as a borazine compound gas or a borazine-based gas.

Figure 13A:
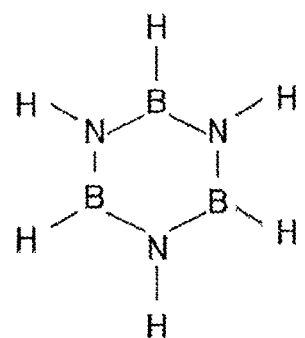
FIG. 13A is a view showing a chemical structural formula of borazine.
Figure 13B:
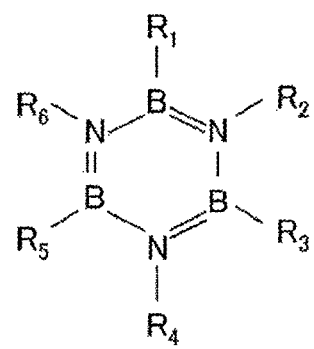
FIG. 13B is a view showing a chemical structural formula of a borazine compound.

As used herein, borazine refers to a heterocyclic compound composed of three elements, B, N and H. Borazine may be represented by a composition formula of $B_3H_6N_3$ and may be denoted as a chemical structural formula shown in FIG. 13A. A borazine compound is a compound which includes a borazine ring skeleton (also referred to as a "borazine skeleton") constituting a borazine ring containing three B atoms and three N atoms. The organic borazine compound is a borazine compound containing C, and may also be referred to as a borazine compound containing a C-containing ligand, namely an organic ligand. The alkyl borazine compound is a borazine compound containing an alkyl group and may be referred to as a borazine compound containing an alkyl group as an organic ligand. The alkyl borazine compound is a compound in which at least one of six H atoms contained in borazine is substituted with hydrocarbon containing one or more C atoms, and may be denoted as a chemical structural formula shown in FIG. 13B. In this case, each of $R_1$ to $R_6$ in the chemical structural formula shown in FIG. 13B is a H atom or an alkyl group containing one to four C atoms. $R_1$ to $R_6$ may be the same kind of alkyl group or may be different kinds of alkyl groups. However, not all of $R_1$ to $R_6$ should be H. The alkyl borazine compound may refer to a substance including a borazine ring skeleton, which constitutes a borazine ring, and contains B, N, H, and C. Further, the alkyl borazine compound may refer to a substance having a borazine ring skeleton and containing an alkyl ligand. In addition, each of $R_1$ to $R_6$ may be an H atom, or an alkenyl group or an alkynyl group containing one to four C atoms. $R_1$ to $R_6$ may be the same kind of an alkenyl group or an alkynyl group, or may be different kinds of alkenyl groups or alkynyl groups. However, not all of $R_1$ to $R_6$ should be H.

The borazine-based gas acts as a B source, an N source and a C source in a substrate processing procedure which will be described later.

Figure 13C:
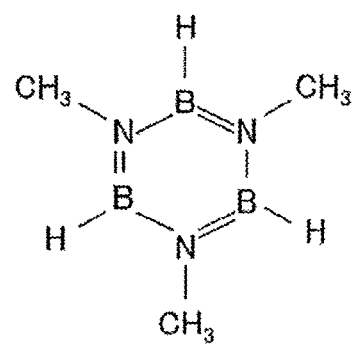
FIG. 13C is a view showing a chemical structural formula of n,n',n"-trimethylborazine.
Figure 13D:
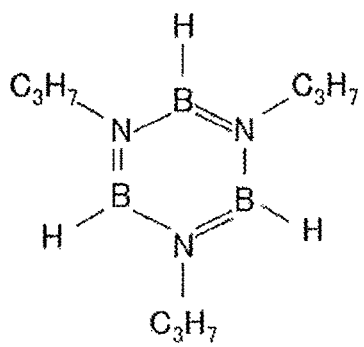
FIG. 13D is a view showing a chemical structural formula of n,n',n"-tri-n-propylborazine.

As the borazine-based gas, it may be possible to use, e.g., an n, n', n"-trimethylborazine (abbreviation: TMB) gas; an n, n', n"-triethylborazine (abbreviation: TEB) gas; an n, n', n"-tri-n-propylborazine (abbreviation: TPB) gas; an n, n', n"-triisopropylborazine (abbreviation: TIPB) gas; an n, n', n"-tri-n-butylborazine (abbreviation: TBB) gas; an n, n', n"-triisobutylborazine (abbreviation: TIBB) gas, or the like. TMB is a borazine compound in which $R_1$, $R_3$, and $R_5$ of the chemical structural formula shown in FIG. 13B are H atoms while $R_2$, $R_4$, and $R_6$ of the chemical structural formula are methyl groups. TMB may be denoted as a chemical structural formula shown in FIG. 13C. TEB is a borazine compound in which $R_1$, $R_3$, and $R_5$ of the chemical structural formula shown in FIG. 13B are H atoms while $R_2$, $R_4$, and $R_6$ of the chemical structural formula are ethyl groups. TPB is a borazine compound in which $R_1$, $R_3$, and $R_5$ of the chemical structural formula shown in FIG. 13B are H atoms while $R_2$, $R_4$, and $R_6$ of the chemical structural formula are propyl groups. TPB may be denoted as a chemical structural formula shown in FIG. 13D. TIPB is a borazine compound in which $R_1$, $R_3$, and $R_5$ of the chemical structural formula shown in FIG. 13B are H atoms while $R_2$, $R_4$, and $R_6$ of the chemical structural formula are isopropyl groups. TIBB is a borazine compound in which $R_1$, $R_3$, and $R_5$ of the chemical structural formula shown in FIG. 13B are H atoms while $R_2$, $R_4$, and $R_6$ of the chemical structural formula are isobutyl groups.

In the case of using a borazine compound such as TMB or the like, which is in a liquid state under a room temperature and an atmospheric pressure, the borazine compound in a liquid state is vaporized by a vaporization system such as a vaporizer or a bubbler, and is supplied as a borazine-based gas (e.g., a TMB gas or the like).

A reactant containing elements (a second element and a third element) differing from the aforementioned first element, for example, a carbon (C)-containing gas as a reaction gas, may be supplied from the gas supply pipe 232d into the process chamber 201 via the MFC 241d, the valve 243d, the gas supply pipe 232c, the nozzle 249c and the buffer chamber 237. As the C-containing gas, it may be possible to use, e.g., a hydrocarbon-based gas. The hydrocarbon-based gas may be referred to as a substance consisting of only two elements C and H. The hydrocarbon-based gas acts as a C source in a substrate processing procedure which will be described later. As the hydrocarbon-based gas, it may be possible to use, e.g., a propylene ($C_3H_6$) gas.

An inert gas, for example, a nitrogen ($N_2$) gas, is supplied from the gas supply pipes 232e to 232g into the process chamber 201 via the MFCs 241e to 241g, the valves 243e to 243g, the gas supply pipes 232a to 232c, the nozzles 249a to 249c, and the buffer chamber 237. The inert gas supplied via the gas supply pipes 232e to 232g acts as a purge gas, a dilution gas or a carrier gas.

In the case of supplying the aforementioned precursor from the gas supply pipe 232a, a first precursor supply system is mainly configured by the gas supply pipe 232a, the MFC 241a, and the valve 243a. The first precursor supply system may also include the nozzle 249a. The first precursor supply system may be referred to as a first precursor gas supply system. In the case of supplying a halosilane precursor gas from the gas supply pipe 232a, the first precursor supply system may be referred to as a halosilane precursor supply system or a halosilane precursor gas supply system. In the case of supplying an alkyl halosilane precursor gas from the gas supply pipe 232a, the first precursor supply system may be referred to as an alkyl halosilane precursor supply system or an alkyl halosilane precursor gas supply system.

In the case of supplying the aforementioned precursor from the gas supply pipe 232b, a second precursor supply system is mainly configured by the gas supply pipe 232b, the MFC 241b, and the valve 243b. The second precursor supply system may also include the nozzle 249b. The second precursor supply system may be referred to as a second precursor gas supply system. In the case of supplying an alkylene halosilane precursor gas from the gas supply pipe 232b, the second precursor supply system may be referred to as an alkylene halosilane precursor supply system or an alkylene halosilane precursor gas supply system.

In the case of supplying an N-containing gas from the gas supply pipe 232c, an N-containing gas supply system is mainly configured by the gas supply pipe 232c, the MFC 241c, and the valve 243c. The N-containing gas supply system may also include the nozzle 249c and the buffer chamber 237. The N-containing gas supply system may be referred to as a nitriding gas supply system or a nitriding agent supply system. In the case of supplying a hydrogen nitride-based gas from the gas supply pipe 232c, the N-containing gas supply system may be referred to as a hydrogen nitride-based gas supply system or a hydrogen nitride supply system.

In the case of supplying an O-containing gas from the gas supply pipe 232c, an O-containing gas supply system is mainly configured by the gas supply pipe 232c, the MFC 241c, and the valve 243c. The O-containing gas supply system may also include the nozzle 249c and the buffer chamber 237. The O-containing gas supply system may be referred to as an oxidizing gas supply system or an oxidizing agent supply system.

In the case of supplying an N- and C-containing gas from the gas supply pipe 232c, an N- and C-containing gas supply system is mainly configured by the gas supply pipe 232c, the MFC 241c, and the valve 243c. The N- and C-containing gas supply system may also include the nozzle 249c and the buffer chamber 237. In the case of supplying an amine-based gas from the gas supply pipe 232c, the N- and C-containing gas supply system may be referred to as an amine-based gas supply system or an amine supply system. The N- and C-containing gas is an N-containing gas and a C-containing gas. Therefore, the N- and C-containing gas supply system may be included in an N-containing gas supply system or a C-containing gas supply system.

In the case of supplying a B-containing gas from the gas supply pipe 232c, a B-containing gas supply system is mainly configured by the gas supply pipe 232c, the MFC 241c, and the valve 243c. The B-containing gas supply system may also include the nozzle 249c and the buffer chamber 237. In the case of supplying a borane-based gas from the gas supply pipe 232c, the B-containing gas supply system may be referred to as a borane-based gas supply system or a borane compound supply system. In the case of supplying a borazine-based gas from the gas supply pipe 232c, the B-containing gas supply system may be referred to as a borazine-based gas supply system, an organic borazine-based gas supply system, or a borazine compound supply system. The borazine-based gas is a B-containing gas, an N- and C-containing gas, an N-containing gas and a C-containing gas. Thus, the borazine-based gas supply system may be included in an N- and C-containing gas supply system, an N-containing gas supply system or a C-containing gas supply system.

In the case of supplying a C-containing gas from the gas supply pipe 232d, a C-containing gas supply system is mainly configured by the gas supply pipe 232d, the MFC 241d, and the valve 243d. The C-containing gas supply system may also include the downstream side of a connection portion of the gas supply pipe 232c and the gas supply pipe 232d, the nozzle 249c and the buffer chamber 237. In the case of supplying a hydrocarbon-based gas from the gas supply pipe 232d, the C-containing gas supply system may be referred to as a hydrocarbon-based gas supply system or a hydrocarbon supply system.

One or all of the N-containing gas supply system, the O-containing gas supply system, the N- and C-containing gas supply system, the B-containing gas supply system and the C-containing gas supply system may be referred to as a reactant supply system or a reaction gas supply system.

In addition, an inert gas supply system is mainly configured by the gas supply pipes 232e to 232g, the MFCs 241e to 241g and the valves 243e to 243g. The inert gas supply system may be referred to as a purge gas supply system, a dilution gas supply system or a carrier gas supply system.

Figure 2:
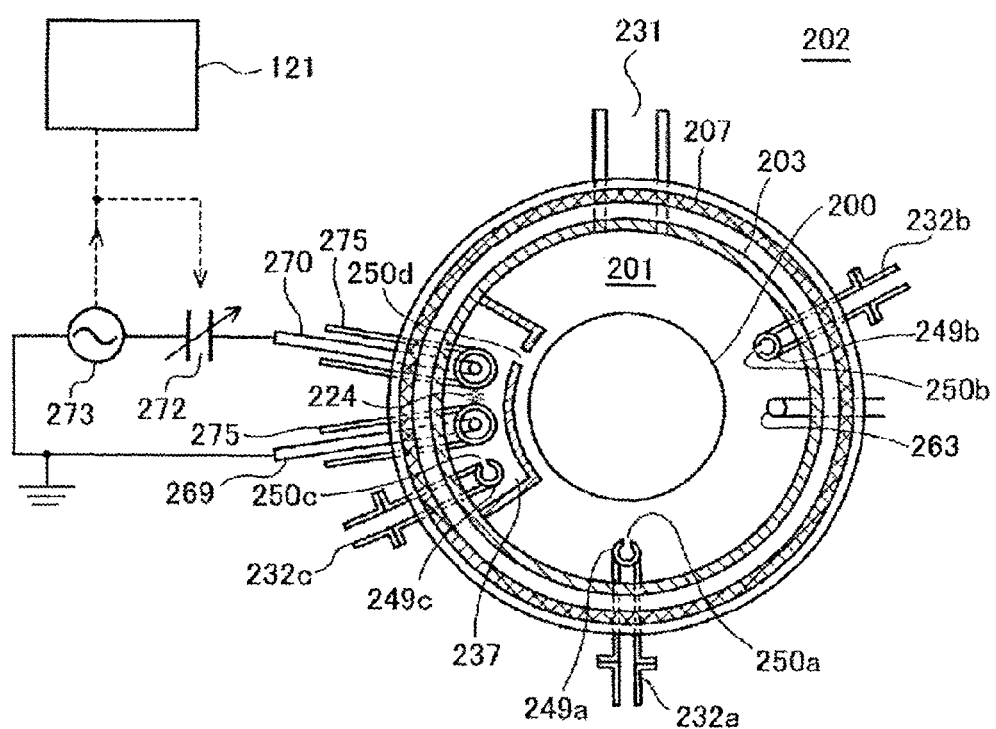
FIG. 2 is a schematic configuration view of the vertical processing furnace of the substrate processing apparatus suitably used in one embodiment of the present disclosure, in which a portion of the processing furnace is shown in a cross section taken along line A-A in FIG. 1.

In the buffer chamber 237, as illustrated in FIG. 2, two rod-shaped electrodes 269 and 270, which are made of a conductor and have an elongated structure, are disposed along the stacking direction of the wafers 200 to span from the lower portion of the reaction tube 203 to the upper portion thereof. Each of the rod-shaped electrodes 269 and 270 is disposed parallel to the nozzle 249c. Each of the rod-shaped electrodes 269 and 270 is covered with and protected by an electrode protection tube 275 over a region spanning from an upper portion to a lower portion thereof. One of the rod-shaped electrodes 269 and 270 is connected to a high-frequency power source 273 via a matcher 272, and the other is connected to ground having a reference electric potential. By applying high-frequency (RF) power from the high-frequency power source 273 between the rod-shaped electrodes 269 and 270 via the matcher 272, plasma is generated in a plasma generation region 224 between the rod-shaped electrodes 269 and 270. A plasma source as a plasma generator (plasma generating part) includes the rod-shaped electrodes 269 and 270 and the electrode protection tubes 275. The matcher 272 and the high-frequency power source 273 may also be included in the plasma source. As will be described later, the plasma source functions as an exciting part (an activating mechanism) that plasma-excites gas, namely excites (activates) gas into a plasma state.

The electrode protection tube 275 has a structure in which each of the rod-shaped electrodes 269 and 270 can be inserted into the buffer chamber 237 while keeping each of the rod-shaped electrodes 269 and 270 isolated from an internal atmosphere of the buffer chamber 237. If an O concentration within the electrode protection tube 275 is substantially equal to an O concentration in ambient air (atmosphere), each of the rod-shaped electrodes 269 and 270 inserted into the electrode protection tubes 275 is oxidized by the heat generated from the heater 207. By charging the interior of the electrode protection tubes 275 with an inert gas such as a $N_2$ gas or the like, or by purging the interior of the electrode protection tubes 275 with an inert gas such as a $N_2$ gas or the like through the use of an inert gas purge mechanism, it is possible to reduce the O concentration within the electrode protection tubes 275, thereby preventing oxidation of the rod-shaped electrodes 269 and 270.

An exhaust pipe 231 for exhausting an internal atmosphere of the process chamber 201 is connected to the reaction tube 203. A vacuum exhaust device, e.g., a vacuum pump 246, is connected to the exhaust pipe 231 via a pressure sensor 245, which is a pressure detector (pressure detecting part) for detecting an internal pressure of the process chamber 201, and an Auto Pressure Controller (APC) valve 244, which is a pressure regulator (pressure regulating part). The APC valve 244 is configured to perform or stop vacuum exhaust in the process chamber 201 by opening or closing the valve while the vacuum pump 246 is actuated and is also configured to regulate the internal pressure of the process chamber 201 by adjusting an opening degree of the valve pursuant to pressure information detected by the pressure sensor 245 while the vacuum pump 246 is actuated. An exhaust system includes the exhaust pipe 231, the APC valve 244, and the pressure sensor 245. The vacuum pump 246 may be included in the exhaust system.

A seal cap 219, which serves as a furnace opening cover configured to hermetically seal a lower end opening of the reaction tube 203, is installed under the reaction tube 203. The seal cap 219 is configured to make contact with the lower end of the reaction tube 203 at a lower side in the vertical direction. The seal cap 219 is made of metal such as, e.g., stainless steel or the like, and is formed into a disc shape. An O-ring 220, which is a seal member making contact with the lower end portion of the reaction tube 203, is installed on an upper surface of the seal cap 219. A rotary mechanism 267 configured to rotate a boat 217, which will be described later is installed at a side of the seal cap 219 apposite to the process chamber 201. A rotary shaft 255 of the rotary mechanism 267, which penetrates through the seal cap 219, is connected to the boat 217. The rotary mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. As such, the boat elevator 115 is configured as a transfer device (transfer mechanism) which transfers the boat 217, ultimately, the wafers 200, into and out of the process chamber 201.

The boat 217 serving as a substrate support is configured to support a plurality of wafers 200, e.g., 25 to 200 wafers, in such a state that the wafers 200 are arranged in a horizontal posture and in multiple stages along a vertical direction, with the centers of the wafers 200 concentrically aligned, to be spaced-apart from one another. The boat 217 is made of heat resistant material such as quartz or SiC. Heat insulating plates 218 made of heat resistant material such as quartz or SiC are installed below the boat 217 in a horizontal posture and in multiple stages. With this configuration, it is hard for heat generated from the heater 207 to be transferred to the seal cap 219. However, the present embodiment is not limited to the above-described configuration. For example, instead of installing the heat insulating plates 218 below the boat 217, a heat insulating tube as a tubular member made of heat resistant material such as quartz or SiC may be installed below the boat 217.

A temperature sensor 263 serving as a temperature detector is installed in the reaction tube 203. Based on temperature information detected by the temperature sensor 263, a state of supplying electronic power to the heater 207 is adjusted such that the interior of the process chamber 201 has a desired or specified temperature distribution. Similar to the nozzles 249a to 249c, the temperature sensor 263 is formed in an L-shape. The temperature sensor 263 is installed along the inner wall of the reaction tube 203.

Figure 3:
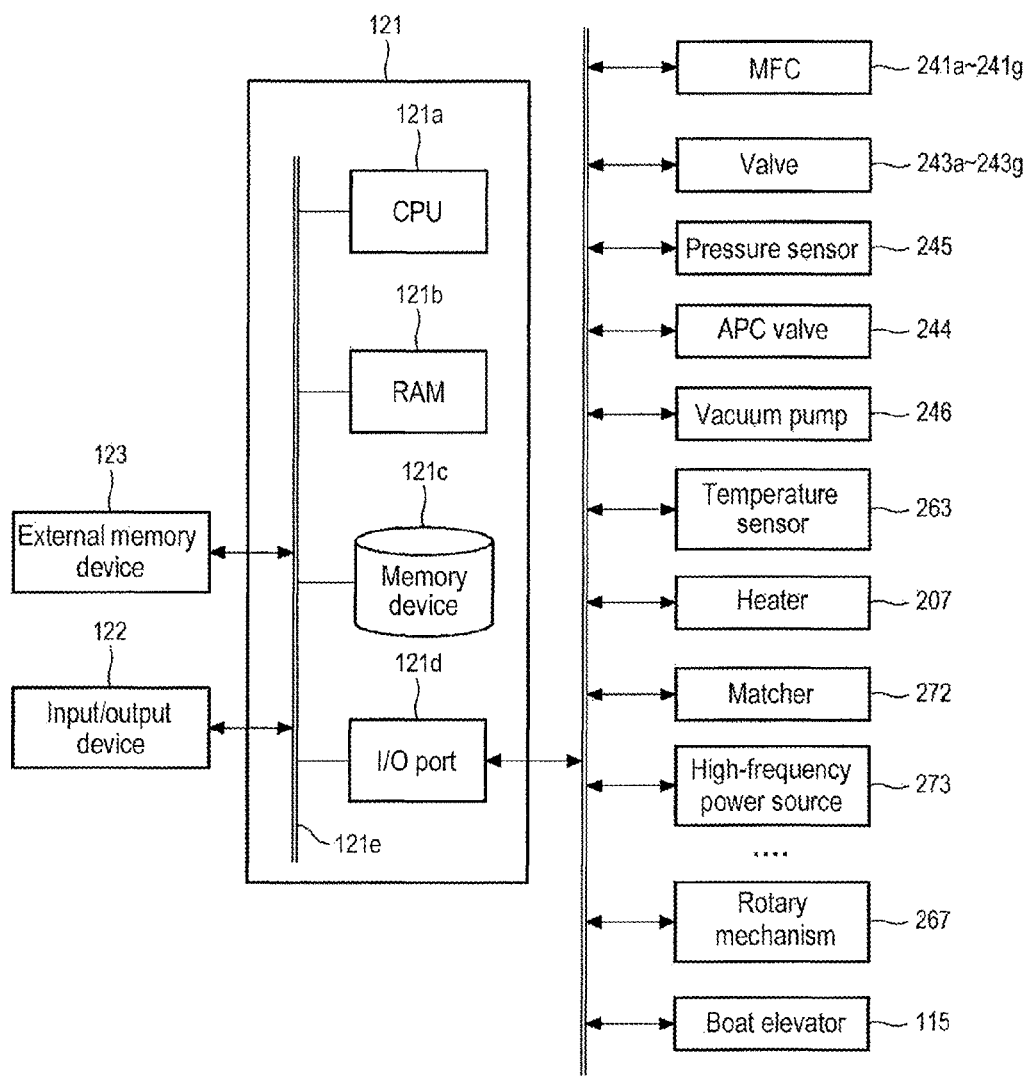
FIG. 3 is a schematic configuration view of a controller of the substrate processing apparatus suitably used in one embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured with, for example, a flash memory, a hard disc drive (HDD), or the like. A control program for controlling operations of a substrate processing apparatus or a process recipe, in which a sequence or condition for processing a substrate to be described later is written, is readably stored in the memory device 121c. Also, the process recipe functions as a program for the controller 121 to execute each sequence in the substrate processing procedure, which will be described later, to obtain a predetermined result. Hereinafter, such a process recipe or control program may be generally referred to as "a program." Also, when the term "program" is used herein, it may indicate a case of including only a process recipe, a case of including only a control program, or a case of including both a process recipe and a control program. In addition, the RAM 121b is configured as a memory area (work area) in which a program or data read by the CPU 121a is temporarily stored.

The I/O port 121d is connected to the MFCs 241a to 241g, the valves 243a to 243g, the pressure sensor 245, the APC valve 244, the vacuum pump 246, the heater 207, the temperature sensor 263, the high-frequency power source 273, the matcher 272, the rotary mechanism 267, the boat elevator 115, and the like.

The CPU 121a is configured to read and execute the control program from the memory device 121c. The CPU 121a also reads the process recipe from the memory device 121c according to an input of an operation command from the input/output device 122. In addition, the CPU 121a is configured to control the flow rate adjusting operation of various kinds of gases by the MFCs 241a to 241g, the opening/closing operation of the valves 243a to 243g, the opening/closing operation of the APC valve 244, the pressure regulating operation performed by the APC valve 244 based on the pressure sensor 245, the start/stop operation of the vacuum pump 246, the temperature adjusting operation performed by the heater 207 based on the temperature sensor 263, the power supply operation of the high-frequency power source 273, the impedance adjusting operation performed by the matcher 272, the operation of rotating the boat 217 with the rotary mechanism 267 and adjusting the rotation speed of the boat 217, the operation of moving the boat 217 up and down with the boat elevator 115, and the like, according to contents of the read process recipe.

Moreover, the controller 121 is not limited to being configured as a dedicated computer but may be configured as a general-purpose computer. For example, the controller 121 according to the present embodiment may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, means for providing the program to the computer is not limited to the case in which the program is provided through the external memory device 123. For example, the program may be supplied using communication means such as the Internet or a dedicated line, rather than through the external memory device 123. Also, the memory device 121c or the external memory device 123 is configured as a non-transitory computer-readable recording medium. Hereinafter, the means for supplying the program will be simply referred to as a "recording medium." In addition, when the term "recording medium" is used herein, it may indicate a case of including only the memory device 121c, a case of including only the external memory device 123, or a case of including both the memory device 121c and the external memory device 123.

(2) Substrate Processing Process

An example of a procedure for forming a thin film on a substrate, which is one of the procedures for manufacturing a semiconductor device by using the above described substrate processing apparatus, is described below with reference to FIG. 4. In the following descriptions, the operations of the respective units or parts constituting the substrate processing apparatus are controlled by the controller 121.

Figure 4:
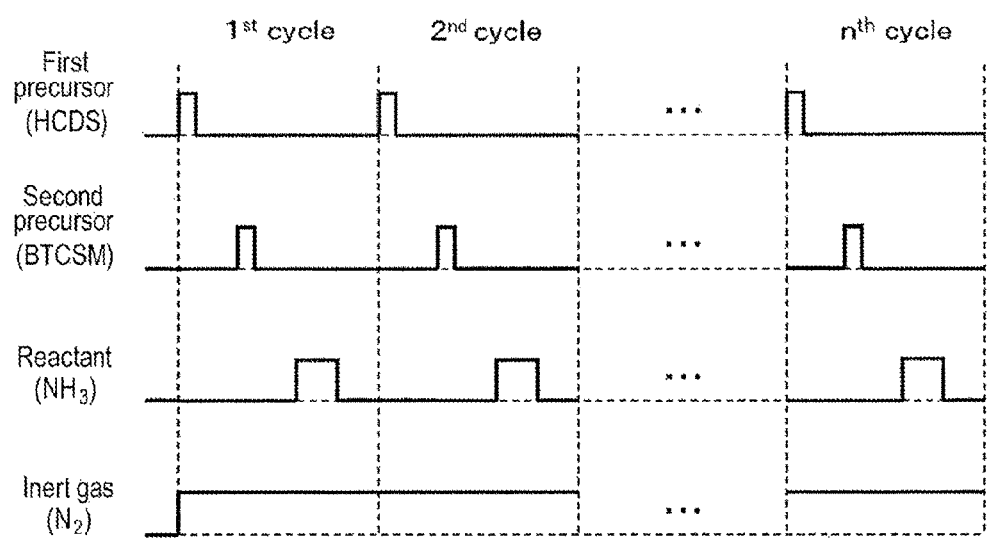
FIG. 4 is a view illustrating gas timings in a film forming sequence according to one embodiment of the present disclosure.

In a film forming sequence shown in FIG. 4, a C-containing silicon nitride film (SiN film) as a film containing Si, C and N is formed on a wafer 200 by performing, a predetermined number of times (one or more times), a cycle that non-simultaneously (without synchronization) performs: a step of supplying an HCDS gas as a first precursor having a Si—Si bond to the wafer W as a substrate; a step of supplying a BTCSM gas as a second precursor not having a Si—Si bond and having a Si—C bond to the wafer 200; and a step of supplying a NH$_3$ gas as a reactant to the wafer 200. The C-containing silicon nitride film may also be referred to as a C-added (doped) SiN film, a C-doped SiN film, a C-containing SiN film, or a SiCN film.

In the subject specification, the aforementioned film forming sequence may sometimes be denoted as follows.

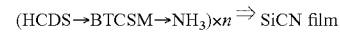

(HCDS→BTCSM→NH$_3$)×n ⇒ SiCN film

As used herein, the term "wafer" may refer to "a wafer itself" or "a wafer and a laminated body (a collected body) of predetermined layers or films formed on a surface of the wafer" (i.e., a wafer including predetermined layers or films formed on its surface may be referred to as a wafer). In addition, as used herein, the phrase "a surface of a wafer" may refer to "a surface (exposed surface) of a wafer itself" or "a surface of a predetermined layer or film formed on a wafer, namely an uppermost surface of the wafer, which is a laminated body".

As such, as used herein, the phrase "a predetermined gas is supplied to a wafer" may mean that "a predetermined gas is directly supplied to a surface (exposed surface) of a wafer itself" or that "a predetermined gas is supplied to a layer or film formed on a wafer, namely on an uppermost surface of a wafer as a laminated body." Also, as used herein, the phrase "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, the term "substrate" as used herein may be synonymous with the term "wafer." In this case, the term "wafer" and "substrate" may be used interchangeably in the above descriptions.

(Wafer Charging and Boat Loading)

When the plurality of wafers 200 is charged on the boat 217 (wafer charging) as illustrated in FIG. 1, the boat 217 charged with the plurality of wafers 200 is lifted up by the boat elevator 115 and is loaded into the process chamber 201 (boat loading). In this state, the seal cap 219 seals the lower end of the reaction tube 203 through the O-ring 220.

(Pressure Regulation and Temperature Adjustment)

An internal pressure of the process chamber 201, namely the space in which the wafers 200 exist is vacuum-exhausted (pressure-reducing exhaust) by the vacuum pump 246 to reach a desired or specified pressure (desired or specified vacuum level). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired or specified temperature. In this operation, the state of supplying electric power to the heater 207 is feedback-controlled based on the temperature information detected by the temperature sensor 263 such that the interior of the process chamber 201 reaches a desired or specified temperature distribution. In addition, the heating of the interior of the process chamber 201 by the heater 207 may be continuously performed at least until the processing of the wafers 200 is completed. The boat 217 and the wafers 200 begin to be rotated by the rotary mechanism 267. The rotation of the boat 217 and the wafers 200 by the rotary mechanism 267 may be continuously performed at least until the processing of the wafers 200 is completed.

(SiCN Film Forming Process)

Next, the following three steps, i.e., Steps 1 to 3, are sequentially performed.

[Step 1]

(HCDS Gas Supply)

At this step, a HCDS gas is supplied to the wafer 200 existing within the process chamber 201.

The valve 243a is opened to flow a HCDS gas through the gas supply pipe 232a. The HCDS gas is flow rate-adjusted by the MFC 241a. The HCDS gas is supplied into the process chamber 201 via the nozzle 249a and is exhausted from the exhaust pipe 231. At this time, the HCDS gas is supplied to the wafer 200. At the same time, the valve 243e is opened to flow a $N_2$ gas through the gas supply pipe 232e. The $N_2$ gas is flow rate-adjusted by the MFC 241e. The flow rate-adjusted $N_2$ gas is supplied into the process chamber 201 together with the HCDS gas and is exhausted from the exhaust pipe 231.

In order to prevent the HCDS gas from infiltrating into the nozzles 249b and 249c and the buffer chamber 237, the valves 243f and 243g are opened to flow the $N_2$ gas through the gas supply pipes 232f and 232g. The $N_2$ gas is supplied into the process chamber 201 through the gas supply pipe 232b and 232c, the nozzles 249b and 249c, and the buffer chamber 237 and is exhausted from the exhaust pipe 231.

A supply flow rate of the HCDS gas controlled by the MFC 241a is set to fall within a range of, e.g., 1 to 2,000 sccm, specifically, 10 to 1,000 sccm. Each of supply flow rates of the $N_2$ gas controlled by the MFCs 241e to 241g is set to fall within a range of, e.g., 100 to 10,000 sccm. An internal pressure of the process chamber 201 is set to fall within a range of, e.g., 1 to 2,666 Pa, specifically 67 to 1,333 Pa. A time period for supplying the HCDS gas to the wafer 200, namely the gas supply time (irradiation time), is set to fall within a range of, e.g., 1 to 120 seconds, specifically, 1 to 60 seconds. The temperature of the heater 207 is set such that the temperature of the wafer 200 falls within a range of, e.g., 250 to 700 degrees C., specifically 300 to 650 degrees C., more specifically 350 to 600 degrees C.

If the temperature of the wafer 200 becomes lower than 250 degrees C., the HCDS gas is hardly chemisorbed onto the wafer 200. Thus, there may be a case where a practical deposition rate is not obtained. This problem may be solved by setting the temperature of the wafer 200 at 250 degrees C. or higher. By setting the temperature of the wafer 200 at 300 degrees C. or higher, ultimately at 350 degrees C. or higher, it is possible to allow the HCDS gas to be sufficiently adsorbed onto the wafer 200. Thus, a sufficient deposition rate is obtained.

If the temperature of the wafer 200 exceeds 700 degrees C., a CVD reaction becomes too strong (an excessive gas phase reaction is generated). Thus, the film thickness uniformity is easily deteriorated and is hardly controlled. By setting the temperature of the wafer 200 at 700 degrees C. or lower, it is possible to generate a suitable gas phase reaction. This makes it possible to suppress deterioration of the film thickness uniformity and to control the film thickness uniformity. Particularly, if the temperature of the wafer 200 is set at 650 degrees C. or lower, ultimately at 600 degrees C. or lower, a surface reaction becomes more dominant than a gas phase reaction. This makes it easy to secure the film thickness uniformity and to control the film thickness uniformity.

Accordingly, the temperature of the wafer 200 may be set to fall within a range of 250 to 700 degrees C., specifically 300 to 650 degrees C., more specifically 350 to 600 degrees C.

However, at Step 2 which will be described later, the temperature of the wafer 200 may need to be set to, fall within a range of, e.g., 400 to 800 degrees C., specifically 500 to 700 degrees C., more specifically 600 to 700 degrees C. In view of this, at Step 1, the temperature of the wafer 200 may be set to fall within a range of, e.g., 400 to 700 degrees C., specifically 500 to 650 degrees C., more specifically 600 to 650 degrees C. In this case, the temperature conditions of Steps 1 and 2 may be set to become the same condition. Furthermore, it becomes unnecessary to change the temperature of the wafer 200, namely the internal temperature of the process chamber 201 (the preset temperature of the heater 207) between Steps 1 and 2. In this case, Steps 1 and 2 may be continuously performed without performing, between Steps 1 and 2, a step of waiting until the internal temperature of the process chamber 201 is stabilized. This makes it possible to improve the productivity of a film forming process. It is also possible to simplify the temperature control in a film forming process.

By supplying the HCDS gas to the wafer 200 under the aforementioned conditions, a seed layer, for example, a Si- and Cl-containing layer having a thickness of less than one atomic layer to several atomic layers, namely a Si-containing layer which contains Cl, is formed on the uppermost surface of the wafer 200. The Si-containing layer which contains Cl may include a Cl-containing Si layer, an adsorption layer of HCDS, or both. The adsorption layer of HCDS may include a physical adsorption layer of HCDS, a chemisorption layer of HCDS, or both. In addition, the seed layer becomes a layer having a Si—Si bond and becomes a layer whose surface is terminated with a Si—Si bond (hereinafter simply referred to as "Cl-terminated"). Since the surface of the seed layer is Cl-terminated, the surface of the seed layer becomes a surface on which, at below-described Step 2, a first layer grows more easily than on the surface of the wafer 200. The seed layer may be referred to as a Si seed layer.

In this regard, the layer having a thickness of less than one atomic layer may mean an atomic layer that is discontinuously formed. The layer having a thickness of one atomic layer may mean an atomic layer that is continuously formed. The layer having a thickness of less than one molecular layer may mean a molecular layer that is discontinuously formed. The layer having a thickness of one molecular layer may mean a molecular layer that is continuously formed. The Si-containing layer which contains Cl may include both a Cl-containing Si layer and an adsorption layer of HCDS. As described above, expressions such as "one atomic layer", "several atomic layers" and the like will be used with respect to the Si-containing layer which contains Cl.

Under a condition in which the HCDS gas is autolyzed (or pyrolyzed), i.e., a condition in which a pyrolysis reaction of the HCDS gas is generated, Si is deposited on the wafer 200 to form the Cl-containing Si layer. Under a condition in which the HCDS gas is not autolyzed (or pyrolyzed), i.e., a condition in which a pyrolysis reaction of the HCDS gas is not generated, HCDS is adsorbed onto the wafer 200 to form an adsorption layer of HCDS. From the viewpoint of increasing the deposition rate, it may be advantageous to form the Cl-containing Si layer on the wafer 200 than to form the adsorption layer of HCDS on the wafer 200.

If the seed layer becomes a layer having a thickness of less than one atomic layer, i.e., a discontinuous layer, Step 2 which will be described later is performed in a state in which the surface of the wafer 200 (film formation base) is partially exposed. In this case, the growth start timing of a first layer formed at Step 2 is hardly made uniform over the entire in-plane region of the wafer 200. There may be a case where the first layer becomes a discontinuous layer. As a result, the film thickness uniformity of a finally-formed SiCN film within the plane of the wafer 200 is easily reduced and the step coverage is easily reduced. Moreover, a pinhole is easily generated in the finally-formed SiCN film. The term "pinhole" refers to a route along which, when an etchant such as an etching gas or an etching solution is supplied to a film, the etchant is infiltrated toward a base of the film. The aforementioned problem may be solved by setting the thickness of the seed layer at a thickness of one atomic layer or more.

If the thickness of a layer (hereinafter often referred to as a "first/seed layer") formed by laminating a seed layer and a first layer exceeds a several atomic layers, a modifying action at below-described Step 3 does not affect the entire first/seed layer. The aforementioned problem may be solved by setting the thickness of the seed layer at a thickness at which the thickness of the first/seed layer becomes several atomic layers or less.

Accordingly, the thickness of the seed layer alone may be set at a thickness of one atomic layer or more. In addition, the thickness of the seed layer may be set at a thickness at which the thickness of the first/seed layer becomes several atomic layers or less.

When forming the seed layer, the supply amount of the HCDS gas may be set larger than the supply amount of the BTCSM gas supplied at Step 2 which will be described later.

Figure 5:
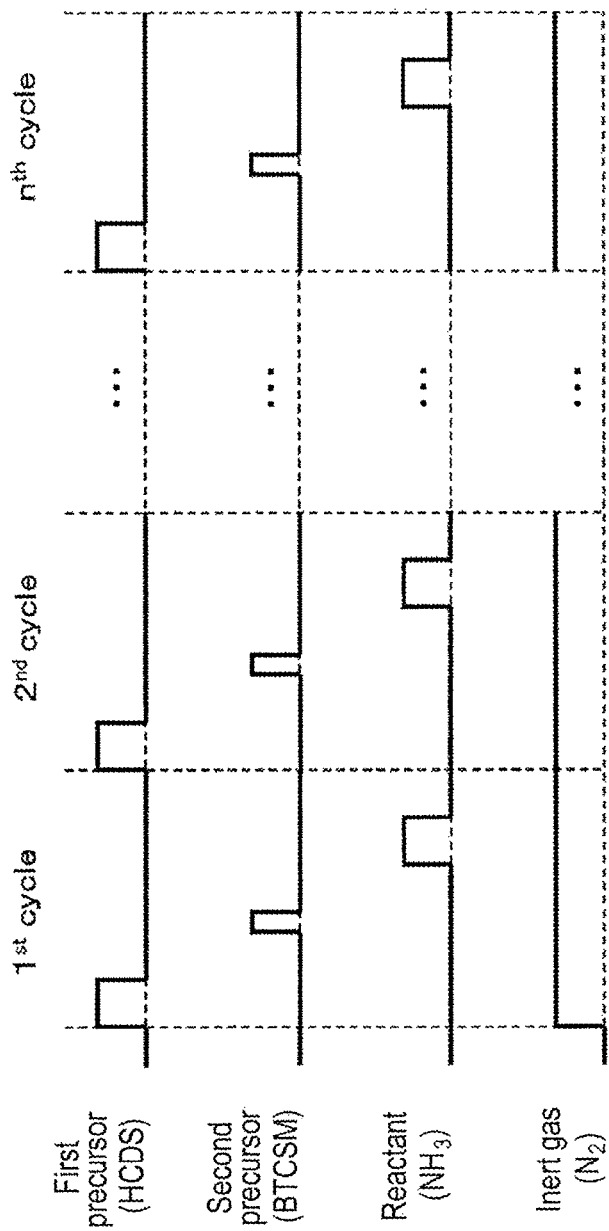
FIG. 5 is a view illustrating an example in which the supply time of a first precursor is set longer than the supply time of a second precursor in the film forming sequence according to one embodiment of the present disclosure.

For example, as shown in FIG. 5, when forming the seed layer, the supply time of the HCDS gas may be set longer than the supply time of the BTCSM gas supplied at Step 2 which will be described later. In this case, for example, the supply time of the HCDS gas supplied at Step 1 may be set at 60 to 120 seconds and the supply time of the BTCSM gas supplied at Step 2 which will be described later may be set at 1 to 30 seconds.

In addition, the supply flow rate of the HCDS gas may be set higher than the supply flow rate of the BTCSM gas supplied at Step 2 which will be described later. In this case, for example, the supply flow rate of the HCDS gas supplied at Step 1 may be set at 1,000 to 2,000 sccm and the supply flow rate of the BTCSM gas supplied at Step 2 which will be described later may be set at 1 to 900 sccm.

In this case, it becomes possible to easily and reliably form the seed layer as a continuous layer. Moreover, it is possible to increase the formation rate of the seed layer and to improve the overall productivity of a film forming process.

(Residual Gas Removal)

After the seed layer is formed, the valve 243a is closed to stop the supply of the HCDS gas. At this time, the APC valve 244 is kept opened and the interior of the process chamber 201 is evacuated by the vacuum pump 246. The HCDS gas remaining within the process chamber 201, which has not reacted or which has contributed to the formation of the seed layer, is removed from the interior of the process chamber 201. At this time, the valves 243e to 243g are kept opened to continuously supply the $N_2$ gas into the process chamber 201. The $N_2$ gas acts as a purge gas. This makes it possible to effectively remove the gas remaining within the process chamber 201 from the interior of the process chamber 201.

In this case, the gas remaining within the process chamber 201 may not be completely removed and the interior of the process chamber 201 may not be completely purged. If the amount of the gas remaining within the process chamber 201 is small, an adverse effect may not be generated at Step 2 which will be subsequently performed. The flow rate of the $N_2$ gas supplied into the process chamber 201 need not be made large. For example, an amount of the $N_2$ gas to be supplied into the process chamber 201 may be set substantially equal to the volume of the reaction tube 203 (the process chamber 201) such that a purge operation is performed without causing an adverse effect at Step 2. As such, by not completely purging the interior of the process chamber 201, it is possible to shorten the purge time and to improve the throughput. It is also possible to suppress the consumption of the $N_2$ gas to a necessary minimum level.

As the first precursor, it may be possible to use, in addition to the HCDS gas, for example, a halosilane precursor gas (fluorosilane precursor gas) such as a hexafluorodisilane ($Si_2F_6$, abbreviation: HFDS) gas or the like and an alkyl halosilane precursor gas such as a TCDMDS gas, a DCTMDS gas, an MCPMDS gas or the like.

By using a C-free halosilane precursor gas as the first precursor, it is possible to prevent C from being added into the seed layer, namely to make the seed layer become a C-free layer. Consequently, it is possible to make a finally-formed SiCN film become a film which has a C concentration lower than that available when a C-containing precursor is used as the first precursor.

Furthermore, by using a C-containing halosilane precursor gas such as an alkyl halosilane precursor gas or the like as the first precursor, it is possible to add C into the seed layer, namely to make the seed layer become a layer which contains Si, C and Cl. Consequently, it is possible to make a finally-formed SiCN film become a film which has a C concentration higher than that available when a C-free precursor is used as the first precursor.

That is to say, by properly selecting the kind of the first precursor, it becomes possible to control a C concentration of a finally-formed SiCN film.

As the inert gas, in addition to the $N_2$ gas, it is possible to use, e.g., a rare gas such as an Ar gas, a He gas, a Ne gas, a Xe gas or the like.

[Step 2]

(BTCSM Gas Supply)

After Step 1 is completed, a BTCSM gas is supplied to the wafer 200 existing within the process chamber 201.

At this step, the opening/closing control of the valves 243b and 243e to 243g is performed in the same procedure as the opening/closing control of the valves 243a and 243e to 243g performed at Step 1. The BTCSM gas is supplied into the process chamber 201 via the gas supply pipe 232b and the nozzle 249b and is exhausted from the exhaust pipe 231. At this time, the BTCSM gas is supplied to the wafer 200.

A supply flow rate of the BTCSM gas controlled by the MFC 241b is set to fall within a range of, e.g., 1 to 2,000 sccm, specifically, 10 to 1,000 sccm. An internal pressure of the process chamber 201 is set to fall within a range of, e.g., 1 to 4,000 Pa, specifically 1 to 2,666 Pa, more specifically 67 to 1,333 Pa. A time period for supplying the BTCSM gas to the wafer 200, namely the gas supply time (irradiation time), is set to fall within a range of, e.g., 1 to 120 seconds, specifically, 1 to 60 seconds. The temperature of the heater 207 is set such that the temperature of the wafer 200 falls within a range of e.g., 400 to 800 degrees C., specifically 500 to 700 degrees C., more specifically 600 to 700 degrees C.

If the temperature of the wafer 200 is lower than 400 degrees C., BTCSM is hard to be chemisorbed onto the wafer 200, eventually making it impossible to obtain a practical deposition rate. By setting the temperature of the wafer 200 at 400 degrees C. or more, it becomes possible to have BTCSM adsorbed onto the wafer 200 to thereby increase the deposition rate. By setting the temperature of the wafer 200 at 500 degrees C. or more, it becomes possible to have BTCSM sufficiently adsorbed onto the wafer 200 to thereby obtain a sufficient deposition rate. By setting the temperature of the wafer 200 at 600 degrees C. or more, specifically, at 650 degrees C. or more, it becomes possible to have BTCSM further sufficiently adsorbed onto the wafer 200 to thereby obtain a further sufficient deposition rate.

If the temperature of the wafer 200 exceeds 800 degrees C., a CVD reaction may be made too strong (an excessive gas phase reaction may be generated). In this case, the film thickness uniformity may be hard to control and often deteriorate. By setting the temperature of the wafer 200 at 800 degrees C. or less, a suitable gas phase reaction may be generated. In this way, the deterioration of the film thickness uniformity can be suppressed, and thus the film thickness uniformity can be controlled. In particular, if the temperature of the wafer 200 is set at 700 degrees C. or less, the surface reaction becomes more dominant than the gas phase reaction. Thus, it becomes possible to secure the film thickness uniformity and control the film thickness uniformity.

Accordingly, the temperature of the wafer 200 may be set to fall within a range of 400 degrees C. or more and 800 degrees C. or less, specifically 500 degrees C. or more and 700 degrees C. or less, more specifically 600 degrees C. or more and 700 degrees C. or less. The BTCSM gas is low in degradability (low in reactivity) and a pyrolysis temperature of the BTCSM gas is high. Therefore, even if a film is formed in a relatively-high temperature zone of, e.g., 650 to 800 degrees C., it is possible to generate a suitable gas phase reaction. Thus, it becomes possible to suppress generation of an excessive gas phase reaction and suppress resultant generation of particles.

However, as described above, at Step 2, the temperature of the wafer 200 may be set a temperature equal to the temperature of the wafer 200 used at Step 1. For example, the temperature of the wafer 200 may be set to fall within a range of 400 to 700 degrees C., specifically 500 to 650 degrees C., more specifically 600 to 650 degrees C. By setting the temperature conditions of Steps 1 and 2 at the same temperature condition, it is possible to improve the productivity of a film forming process and to simplify the temperature control in a film forming process.

Other processing conditions are similar to the processing conditions of Step 1.

By supplying the BTCSM gas to the wafer 200 under the aforementioned conditions, a first layer, e.g., a Si-containing layer containing C and Cl and having a thickness of one atomic layer or less to several atomic layers, is formed on the seed layer. The Si-containing layer containing C and Cl may become a layer which includes a Si—C bond. The Si-containing layer containing C and Cl may be a Si layer, an adsorption layer of BTCSM, or both.

The Si-containing layer containing C and Cl is a generic name that encompasses a continuous or discontinuous layer containing C and Cl, which is composed of Si, and a Si thin film containing C and Cl, which is formed of the layers overlapping with one another. The continuous layer containing C and Cl, which is composed of Si, is sometimes referred to as a Si thin film containing C and Cl. The Si which constitutes the Si layer containing C and Cl includes not only Si whose bond to C or Cl is not completely broken, but also Si whose bond to C or Cl is completely broken.

The adsorption layer of BTCSM includes a continuous adsorption layer composed of BTCSM molecules and a discontinuous adsorption layer composed of BTCSM molecules. That is to say, the adsorption layer of BTCSM includes an adsorption layer having a thickness of one molecular layer or less, which is composed of BTCSM molecules. The BTCSM molecules that constitute the adsorption layer of BTCSM include a BTCSM molecule in which a part of bonds of Si and C is broken and a BTCSM molecule in which a part of bonds of Si and Cl is broken. In other words, the adsorption layer of BTCSM may be a physical adsorption layer of BTCSM, a chemisorption layer of BTCSM, or both.

In this regard, the layer having a thickness of less than one atomic layer may mean an atomic layer that is discontinuously formed. The layer having a thickness of one atomic layer may mean an atomic layer that is continuously formed. The layer having a thickness of less than one molecular layer may mean a molecular layer that is discontinuously formed. The layer having a thickness of one molecular layer may mean a molecular layer that is continuously formed. The silicon-containing layer containing C and Cl may include both a Si layer containing C and Cl and an adsorption layer of BTCSM. As described above, expressions such as "one atomic layer", "several atomic layers" and the like will be used with respect to the Si-containing layer containing C and Cl.

Under a condition in which the BTCSM gas is autolyzed (or pyrolyzed), i.e., a condition in which a pyrolysis reaction of the BTCSM gas is generated, Si is deposited on the seed layer to form the Si layer containing C and Cl. Under a condition in which the BTCSM gas is not autolyzed (or pyrolyzed), i.e., a condition in which a pyrolysis reaction of the BTCSM gas is not generated, BTCSM is adsorbed onto the seed layer to form an adsorption layer of BTCSM. In either condition, the Si—C bond of the BTCSM gas is broken, whereby C or Si having a dangling bond is bonded to Si of the seed layer. Furthermore, in either condition, at least a part of the Si—C bonds of the BTCSM gas is maintained without being broken and is directly introduced into the Si-containing layer containing C and Cl (the Si layer containing C and Cl or the adsorption layer of BTCSM). For example, even if one Si—C bond of a Si—C—Si bond of the BTCSM gas is broken, the other Si—C bond is maintained without being broken and is directly introduced into the Si layer containing C and Cl. From the viewpoint of increasing the deposition rate, it may be advantageous to form the Si layer containing C and Cl on the seed layer than to form the adsorption layer of BTCSM on the seed layer.

If the thickness of the first/seed layer formed on the wafer 200 exceeds several atomic layers, a modifying reaction at Step 3, which will be described later, does not affect the entire first/seed layer as described above. In addition, a minimum value of the thickness of the first layer to be formed on the wafer 200 is less than one atomic layer. Accordingly, the thickness of the first layer may be set to fall within a range of less than one atomic layer to several atomic layers and may be set at a thickness at which the thickness of the first/seed layer becomes several atomic layers or less.

At Step 2, the formation of the first layer is performed under a condition in which the BTCSM gas supplied into the process chamber 201 is pyrolyzed. This enables the first layer to become a deposition layer, i.e., a solid layer, which is formed by the deposition of Si, C and Cl, rather than a non-solid layer such as a physical adsorption layer of BTCSM. That is to say, it is possible to enable the first layer to become a layer in which a bond between atoms constituting the layer is strong and stable and a layer which has a low probability of desorption of C from the layer.

At Step 2, the formation of the first layer is performed under a condition in which the BTCSM gas supplied into the process chamber 201 is pyrolyzed. This enables the thickness of the first layer to become larger than the thickness of the chemisorption layer (saturated adsorption layer) of BTCSM formed under a condition in which the chemisorption of BTCSM onto the wafer 200 is saturated. The thickness of the first layer becomes, e.g., a thickness which exceeds one atomic layer. In this case, it is possible to enable the first layer to become a layer in which an absolute amount of Si—C bonds contained in the layer is larger than that of the saturated adsorption layer of BTCSM. That is to say, it is possible to enable the first layer to become a layer which contains a larger amount of strong Si—C bonds, which has stronger bonds between atoms constituting the layer and which has a lower probability of desorption of C from the layer.

Accordingly, at Step 2, the first layer may be performed under a condition in which the BTCSM gas is pyrolyzed. The thickness of the first layer alone may be set at a thickness which exceeds one atomic layer.

(Residual Gas Removal)

After the first layer is formed, the valve 243b is closed to stop the supply of the BTCSM gas. Then, by the same procedures as those of Step 1, the BTCSM gas remaining within the process chamber 201, which has not reacted or which has contributed to the formation of the first layer, and the reaction byproducts, are removed from the interior of the process chamber 201. At this time, similar to Step 1, the gas remaining within the process chamber 201 may not be completely removed.

As the second precursor gas, it is possible to use, in addition to the BTCSM gas, for example, a BTCSE gas or the like. As the inert gas, it is possible to use, in addition to the $N_2$ gas, for example, a rare gas such as an Ar gas, a He gas, a Ne gas, a Xe gas or the like.

[Step 3]

($NH_3$ Gas Supply)

After Step 2 is completed, a thermally-activated $NH_3$ gas is supplied to the wafer 200 existing within the process chamber 201.

At this step, the opening/closing control of the valves 243c and 243e to 243g is performed in the same procedure as the opening/closing control of the valves 243a and 243e to 243g performed at Step 1. The $NH_3$ gas is supplied into the process chamber 201 via the gas supply pipe 232c, the nozzle 249c and the buffer chamber 237 and is exhausted from the exhaust pipe 231. At this time, the $NH_3$ gas is supplied to the wafer 200.

A supply flow rate of the $NH_3$ gas controlled by the MFC 241c is set to fall within a range of, e.g., 100 to 10,000 sccm, specifically, 10 to 1,000 sccm. An internal pressure of the process chamber 201 is set to fall within a range of, e.g., 1 to 4,000 Pa, specifically 1 to 3,000 Pa. A partial pressure of the $NH_3$ gas within the process chamber 201 is set to fall within a range of, e.g., 0.01 to 3,960 Pa. By setting the internal pressure of the process chamber 201 to fall within such a relatively high pressure zone, it is possible to thermally activate the $NH_3$ gas in a non-plasma manner. If the $NH_3$ gas is supplied by thermally activating the same, it is possible to generate a relatively soft reaction. This makes it possible to relatively softly perform the nitriding which will be described later. A time period for supplying the thermally-activated $NH_3$ gas to the wafer 200, namely the gas supply time (irradiation time), is set to fall within a range of, e.g., 1 to 120 seconds, specifically, 1 to 60 seconds. Other processing conditions may be similar to, e.g., the processing conditions of Step 1.

By supplying the $NH_3$ gas to the wafer 200 under the aforementioned conditions, at least a part of the first/seed layer is nitrided (modified). As the first/seed layer is modified, a second layer, e.g., a layer containing Si, C and N, namely a C-containing silicon nitride layer (SiN layer), is formed on the wafer 200. The C-containing silicon nitride layer may also be referred to as a G-added (doped) SiN layer, a C-doped SiN layer, a C-containing SiN layer, or a SiCN layer.

When forming the second layer, at least a part of Si—C bonds contained in the first layer is maintained without being broken and is directly introduced into (or remained within) the second layer. In the case where the first layer is formed under a condition in which the BTCSM gas supplied into the process chamber 201 is pyrolyzed, as described above, the first layer becomes a layer which contains a larger amount of strong Si—C bonds and which has strong and stable bonds between atoms constituting the layer. For that reason, it becomes easy to suppress desorption of C from the first layer, which may be caused by the supply of the $NH_3$ gas. Consequently, the second layer becomes a stable layer which contains a larger amount of strong Si—C bonds and which has strong bonds between atoms constituting the layer. Since the percentage of strong Si—C bonds contained in the layer is large and since the bonds between atoms in the layer are strong, the second layer becomes a layer having a low probability of desorption of C.

When forming the second layer, the impurities such as Cl and the like contained in the first/seed layer may become a gaseous substance containing at least Cl during the course of the modifying reaction generated by the $NH_3$ gas. The gaseous substance is discharged from the interior of the process chamber 201. That is to say, the impurities such as Cl and the like contained in the first/seed layer are extracted or desorbed from the first layer and are eventually separated from the first/seed layer. As such, the second layer becomes a layer having a smaller amount of impurities such as Cl and the like than the first/seed layer.

(Residual Gas Removal)

After the second layer is formed, the valve 243c is closed to stop the supply of the $NH_3$ gas. Then, with similar processing procedures to those of Step 1, it is possible to remove the $NH_3$ gas, which has not reacted or remains after contribution to the formation of the second layer, or the reaction byproduct, remaining within the process chamber 201 from the interior of the process chamber 201. Similar to Step 1, the gas remaining within the process chamber 201 may not be completely removed.

As the N-containing gas (nitriding gas), in addition to the $NH_3$ gas, it is possible to use, e.g., a hydrogen nitride-based gas such as a diazene ($N_2H_2$) gas, a hydrazine ($N_2H_4$) gas, an $N_3H_8$ gas or the like, or a gas containing these compounds. As the inert gas, it is possible to use, in addition to the $N_2$ gas, for example, a rare gas such as an Ar gas, a He gas, a Ne gas, a Xe gas, or the like.

(Performing a Cycle a Predetermined Number of Times)

A cycle which non-simultaneously performs above-described Steps 1 to 3 is performed one or more times (a predetermined number of times) to thereby form a SiCN film having a predetermined composition and a predetermined thickness on the wafer 200. The above cycle may be repeated multiple times. As such, the thickness of the SiCN layer formed per one cycle may be set to become smaller than a desired or specified film thickness and the above cycle may be repeated multiple times until the desired or specified film thickness is obtained.

(Purge and Return to Atmospheric Pressure)

The valves 243e to 243g are opened. The $N_2$ gas is supplied into the process chamber 201 from each of the gas supply pipes 232e to 232g, and is exhausted through the exhaust pipe 231. The $N_2$ gas serves as a purge gas. Thus, the interior of the process chamber 201 is purged, and residual gas or the reaction byproduct remaining within the process chamber 201 is removed from the interior of the process chamber 201 (purge). Thereafter, the internal atmosphere of the process chamber 201 is substituted with an inert gas (inert gas substitution), and the internal pressure of the process chamber 201 is returned to atmospheric pressure (return to atmospheric pressure).

(Boat Unloading and Wafer Discharge)

The seal cap 219 is moved down by the boat elevator 115 to open the lower end of the reaction tube 203. The processed wafers 200 supported by the boat 217 are unloaded from the lower end of the reaction tube 203 outside of the reaction tube 203 (boat unloading). Thereafter, the processed wafers 200 are discharged from the boat 217 (wafer discharge).

(3) Effects According to the Present Embodiment

According to the present embodiment, one or more effects may be achieved, as follows.

(a) When forming the seed layer, a gas having a Si—Si bond and exhibiting high adsorptivity, such as a HCDS gas or the like, is used as the precursor gas. Therefore, when performing Step 1, it is possible to start the formation of the seed layer without delay. That is to say, it becomes possible to shorten the incubation time during the formation of the seed layer. Consequently, it is possible to improve the overall productivity of a film forming process. In addition, it is possible to reduce the total consumption of the HCDS gas and to reduce the film formation cost.

(b) The surface of the seed layer is Cl-terminated, whereby the surface of the seed layer becomes a surface on which the first layer grows more easily than on the surface of the wafer 200. Thus, when performing Step 2, it becomes possible to start the formation of the first layer at an early stage thereof without delay. That is to say, even when a gas which does not have a Si—Si bond and has Si—C bonds and which exhibits low adsorptivity, such as a BTCSM gas or the like, is used as the precursor gas, it becomes possible to shorten the incubation time during the formation of the first layer. Consequently, it is possible to sufficiently secure a cycle rate and to improve the overall productivity of a film forming process. In addition, it is possible to reduce the total consumption of the BTCSM gas, which is more expensive than the HCDS gas, and to reduce the film formation cost.

(c) By forming the seed layer as a layer having a thickness of one atomic layer or more, namely as a layer continuously formed over the entire in-plane region of the wafer 200, it is possible to make uniform the incubation time during the formation of the first layer, i.e., the growth start timing of the first layer, over the entire in-plane region of the wafer 200. Thus, it becomes easy to make the first layer become a continuously-formed layer. That is to say, it is possible to prevent variation of the growth start timing within the plane of the wafer 200 from affecting the film thickness within the plane of the wafer 200. It is therefore possible to improve the film thickness uniformity of the SiCN film within the plane of the wafer 200. Even when the film thickness of the SiCN film is set to fall within a thin film region of, e.g., 0.2 nm or more and 10 nm or less, specifically 0.5 nm or more and 10 nm or less, more specifically 1 nm or more and 10 nm or less, it is possible to form a pinhole-free film having good film thickness uniformity. In addition, it is possible to improve the step coverage of the SiCN film.

(d) When performing Step 3, the seed layer and the first layer, both of which are continuously formed, serve as block layers that hinder the direct supply and contact of a reactant to and with the surface of the wafer 200 (film formation base). Thus, it is possible to prevent the film formation base from being modified by a reactant such as a $NH_3$ gas or the like. In addition, it is possible to suppress formation of a layer having an undesired composition, i.e., a transition layer, on an interface between the film formation base and the SiCN film.

(e) By allowing the supply time of the HCDS gas at Step 1 to become longer than the supply time of the BTCSM gas at Step 2, or by allowing the supply flow rate of the HCDS gas at Step 1 to become higher than the supply flow rate of the BTCSM gas at Step 2, it is possible to reliably form an appropriate (trustworthy) seed layer and to easily and reliably form the seed layer as a continuous layer. That is to say, by allowing the supply amount of the HCDS gas at Step 1 to become larger than the supply amount of the BTCSM gas at Step 2, it becomes easy to achieve the aforementioned effect.

Furthermore, by allowing the supply flow rate of the HCDS gas at Step 1 to become higher than the supply flow rate of the BTCSM gas at Step 2, it is possible to increase the formation rate of the seed layer and to improve the overall productivity of a film forming process.

(f) In the case where the formation of the first layer is performed under a condition in which the BTCSM gas is pyrolyzed, it is possible to make the first layer become a layer in which bonds between atoms are strong and stable. It is also possible to have the thickness of the first layer become, e.g., a thickness exceeding one atomic layer, and to increase the absolute amount of Si—C bonds contained in the layer. Furthermore, by using a precursor gas having a plurality of Si—C bonds in one molecule, such as the BTCSM gas or the like, it is possible to increase the absolute amount of Si—C bonds contained in the layer. As a result, it is possible to have the finally-formed SiCN film become a stable film which has a high C concentration, which contains a larger amount of strong Si—C bonds and which has strong bonds between atoms constituting the film. In addition, in the case where the formation of the first layer is performed under a condition in which the BTCSM gas is pyrolyzed, it is possible to increase the deposition rate of the SiCN film and to improve the productivity in a film forming process.

(g) By adding C to the SiN film, even when the SiN film is made thin, it is possible to make the SiN film become a film free from a pinhole, i.e., a pinhole-free film. For that reason, if the SiN film is used as a protective film, it is possible to avoid etching damage of a base, which may otherwise be caused by an etching process. Furthermore, by forming the protective film as a pinhole-free film, it is possible to suppress etching of the protective film itself, which may otherwise be caused by an etching process. It is also be possible to avoid reduction in the function of the SiN film as a protective film.

(h) By adding C to the SiN film, it is possible to make the SiN film become a film which has a high resistance (etching resistance) to an etchant such as HF or the like. For that reason, if the SiN film is used as a protective film, it is possible to suppress etching of the protective film itself, which may otherwise be caused by an etching process. It is therefore possible to maintain the function as a protective film.

(i) By adjusting the ratio in thickness of the seed layer and the first layer, it is possible to control the C concentration in the finally-formed SiCN film. For example, by increasing the ratio of the thickness of the C-free seed layer to the thickness of the first/seed layer, it is possible to reduce the C concentration in the SiCN film. Furthermore, by increasing the ratio of the thickness of the C-containing first layer to the thickness of the first/seed layer, it is possible to increase the C concentration in the SiCN film.

By properly selecting the kind of the first precursor used at Step 1, it is possible to control the C concentration in the finally-formed SiCN film. For example, by using a C-free halosilane precursor gas as the first precursor, it is possible to reduce the C concentration in the SiCN film. Furthermore, by using a C-containing halosilane precursor gas as the first precursor, it is possible to increase the C concentration in the SiCN film.

As described above, according to the present embodiment, as compared with a case where Steps 2 and 3 are alternately performed a predetermined number of times without performing Step 1, it is possible to improve the controllability of the composition ratio of the finally-formed SiCN film and to expand the window of control of the composition ratio of the SiCN film.

(j) By supplying a reactant such as a $NH_3$ gas or the like at Step 3, it is possible to efficiently extract or desorb impurities such as Cl and the like from the first/seed layer. This makes it possible to have the second layer become a layer which is smaller in the amount of impurities than the first/seed layer. Consequently, even in the case where a film is formed in a relatively low temperature zone of e.g., 400 to 500 degrees C., it becomes possible to reduce the impurity concentration in the SiCN film. As a result, it is possible to have the SiCN film become a film which is higher in HF resistance.

By allowing the first/seed layer formed at Steps 1 and 2 to have a thickness of several atomic layers or less, it is possible to relatively increase the action of the modifying reaction at Step 3 and to shorten the time required in the modifying reaction at Step 3. It is also possible to shorten the time required in forming the second layer at Step 3. Consequently, it is possible to shorten the processing time per one cycle and to shorten the overall processing time. That is to say, it becomes possible to increase the deposition rate.

(k) By non-simultaneously performing Steps 1 to 3, namely by non-simultaneously supplying various kinds of gases, it is possible to allow the gases to appropriately contribute to a reaction under a condition in which a gas phase reaction or a surface reaction is properly generated. Consequently, it is possible to improve the step coverage of the SiCN film and the controllability of the film thickness. In addition, it is possible to avoid generation of an excessive gas phase reaction within the process chamber 201 and to suppress generation of particles.

If the HCDS gas and the BTCSM gas are mixed within the process chamber 201, or if the HCDS gas or the BTCSM gas and the $NH_3$ gas are mixed within the process chamber 201, an excessive gas phase reaction may be generated within the process chamber 201, thereby generating particles. In contrast, in the present embodiment, when performing one cycle including Steps 1 to 3 a predetermined number of times, the respective steps are performed non-simultaneously. In addition, a step of purging the interior of the process chamber 201 is performed between the respective steps. It is therefore possible to reliably avoid the mixing of the gases within the process chamber 201. Consequently, it is possible to reliably avoid an excessive gas phase reaction which may otherwise be generated within the process chamber 201. This makes it possible to further suppress generation of particles. It is also possible to further improve the step coverage of the SiCN film and the controllability of the film thickness.

(l) The aforementioned effects may be similarly achieved even in the case where a gas having a Si—Si bond, other than the HCDS gas, is used as the first precursor or even in the case where a gas not having a Si—Si bond and having Si—C bonds, other than the BTCSM gas, is used as the second precursor. In addition, the aforementioned effects may be similarly achieved even in the case where an N-containing gas other than the $NH_3$ gas is used as the reactant or even in the case where a gas other than the N-containing gas, e.g., an N- and C-containing gas, an O-containing gas, a B-containing gas or a C-containing gas, is used as the reactant.

(4) Modifications

The film forming sequence according to the present embodiment is not limited to the form illustrated in FIG. 4 and may be modified as in the modifications to be described below.

(Modification 1)

For example, by a film forming sequence indicated below, a silicon carbonitride film (SiCN film), i.e., a C-containing SiN film, may be formed as a Si-, C- and N-containing film on the wafer 200. Even in this modification, it is possible to achieve the effects similar to those of the film forming sequence shown in FIG. 4.

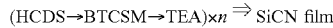 SiCN film (Modification 2)

Figure 6:
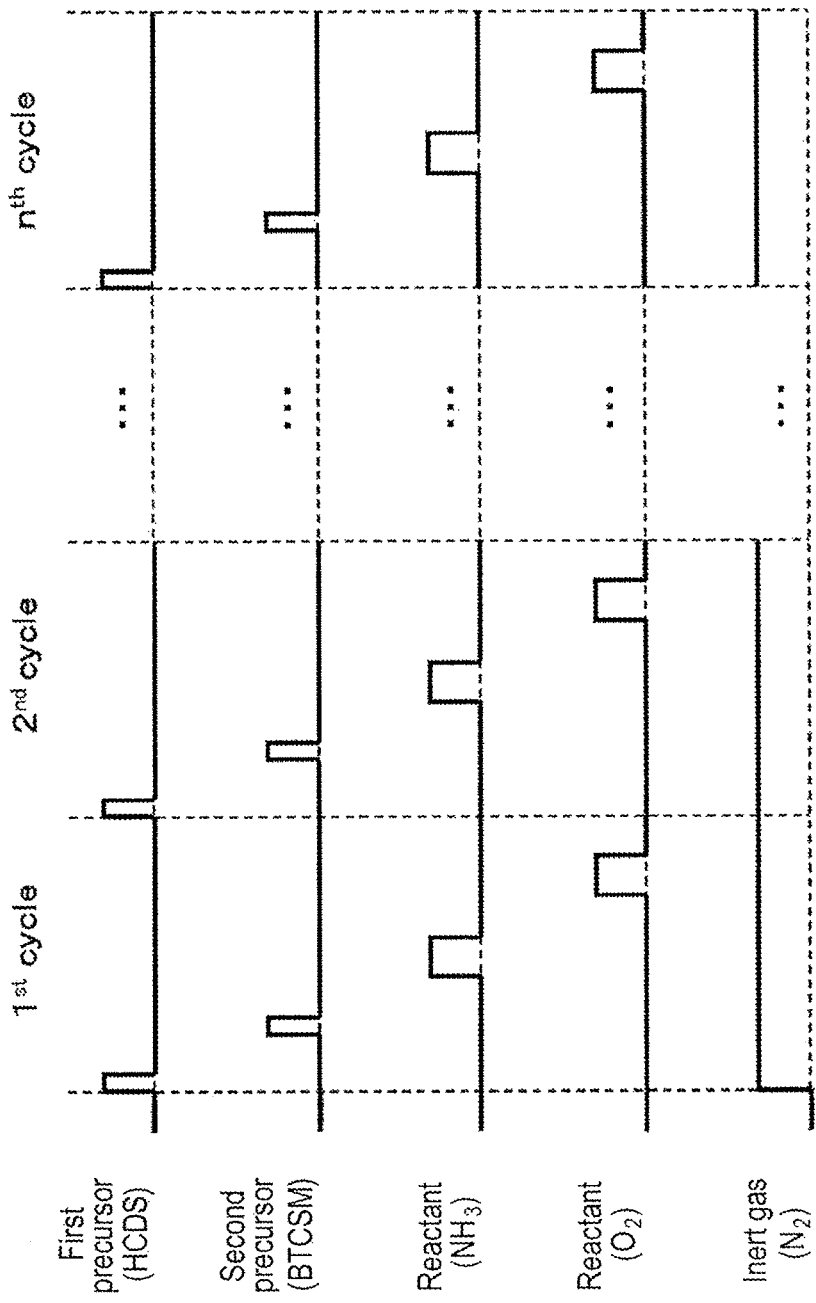
FIG. 6 is a view illustrating gas supply timings in modification 2 of the film forming sequence according to one embodiment of the present disclosure.

For example, by a film forming sequence indicated below, a silicon oxycarbonitride film (SiOCN film), i.e., a C-containing SiON film, may be formed as a Si-, O-, C- and N-containing film on the wafer 200. Even in this modification, it is possible to achieve the effects similar to those of the film forming sequence shown in FIG. 4. FIG. 6 is a view showing the gas supply timings in Modification 2.

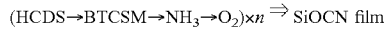 SiOCN film (Modification 3)

For example, by a film forming sequence indicated below, a SiOCN film may be formed on the wafer 200 and a silicon oxycarbide film (SiOC film) may be formed as a Si-, O- and C-containing film on the wafer 200. That is to say, a C-containing SiON film or a C-containing SiO film may be formed on the wafer 200. Even in this modification, it is possible to achieve the effects similar to those of the film forming sequence shown in FIG. 4.

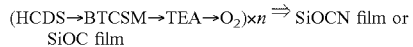 SiOCN film or SiOC film (Modification 4)

For example, by a film forming sequence indicated below, a SiOC film, i.e., a C-containing SiO film, may be formed on the wafer 200. Even in this modification, it is possible to achieve the effects similar to those of the film forming sequence shown in FIG. 4.

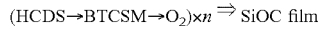 SiOC film (Modifications 5 and 6)

Figure 7:
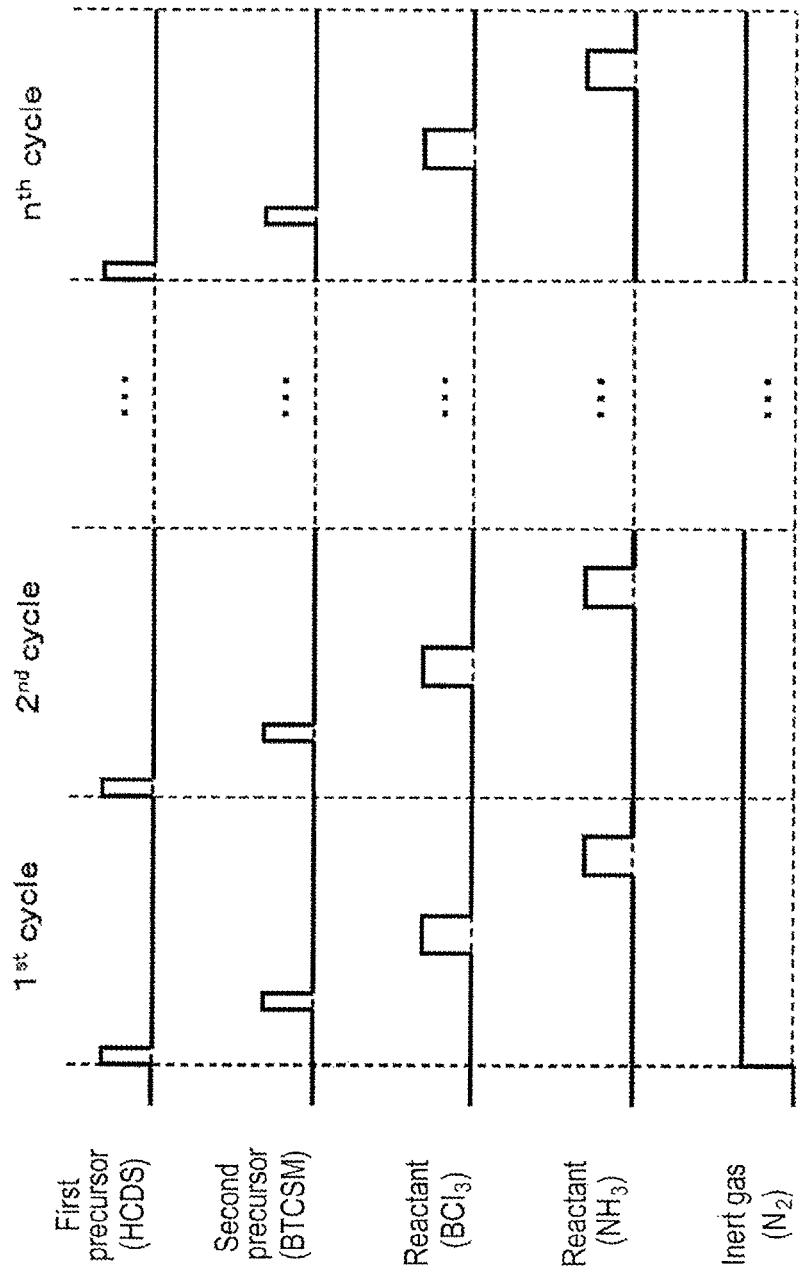
FIG. 7 is a view illustrating gas supply timings in modification 5 of the film forming sequence according to one embodiment of the present disclosure.

For example, by film forming sequences indicated below, a silicon borocarbonitride film (SiBCN film), i.e., a C-containing SiBN film, may be formed as a Si-, B-, C- and N-containing film on the wafer 200. Even in this modification, it is possible to achieve the effects similar to those of the film forming sequence shown in FIG. 4. FIG. 7 is a view showing the gas supply timings in Modification 5.

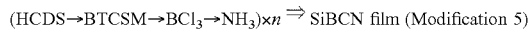 SiBCN film (Modification 5)

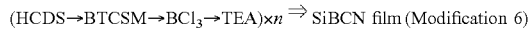 SiBCN film (Modification 6)

(Modifications 7 and 8)

For example, by film forming sequences indicated below, a borazine-ring-skeleton-containing SiBCN film, i.e., a borazine-ring-skeleton-containing and C-containing SiBN film, may be formed on the wafer 200. Even in this modification, it is possible to achieve the effects similar to those of the film forming sequence shown in FIG. 4.

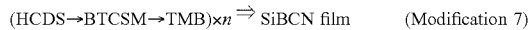 SiBCN film (Modification 7)

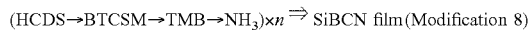 SiBCN film (Modification 8)

(Modifications 9 to 13)

Figure 8:
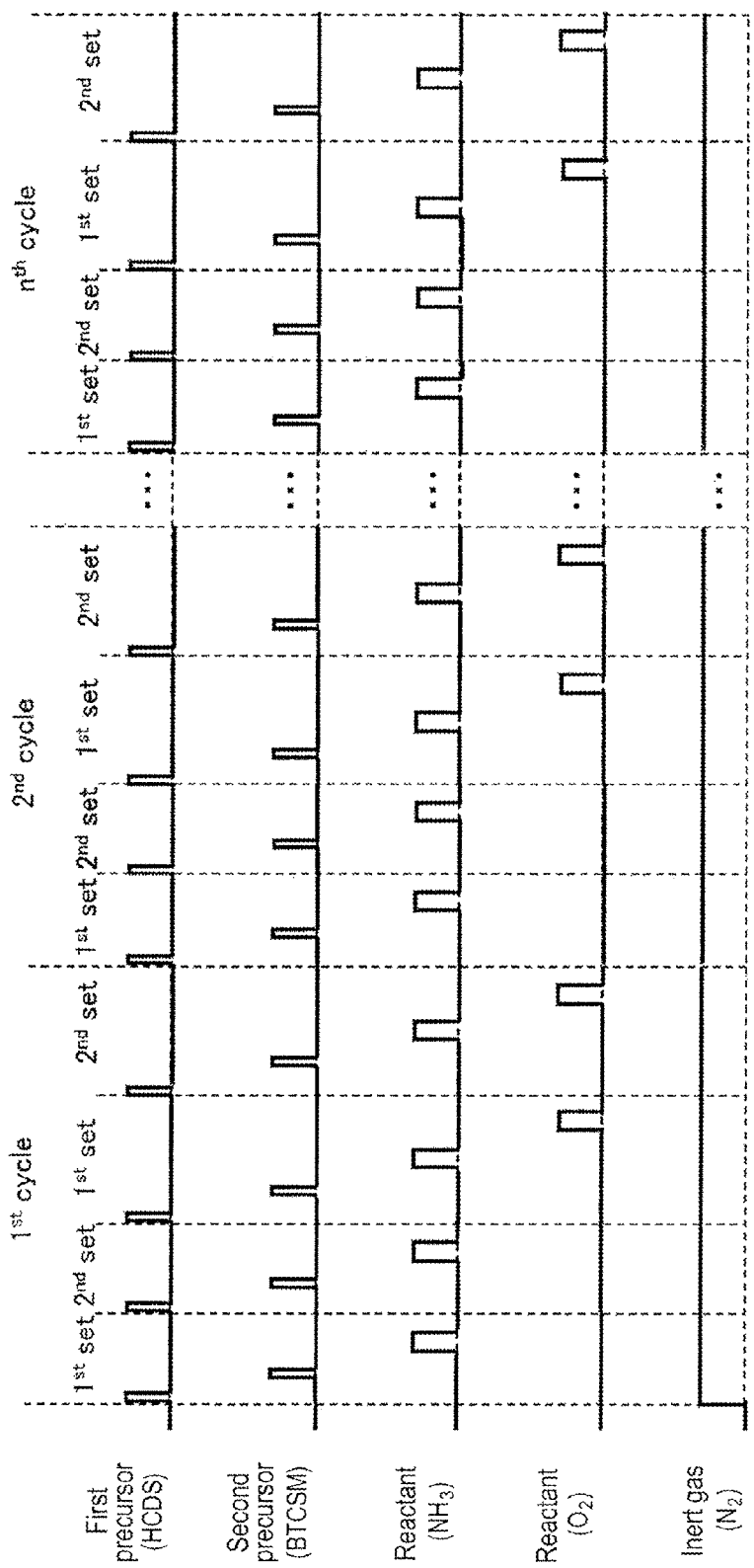
FIG. 8 is a view illustrating gas supply timings in modification 9 of the film forming sequence according to one embodiment of the present disclosure.

For example, by film forming sequences indicated below, a laminated film composed of a first film and a second film alternately laminated at a nano level, i.e., a nano laminate film, may be formed on the wafer 200. Hereinafter, the laminated film of the first film and the second film will be often referred to as a "first/second film". Even in this modification, it is possible to achieve the effects similar to those of the film forming sequence shown in FIG. 4. FIG. 8 is a view showing the gas supply timings in Modification 9.

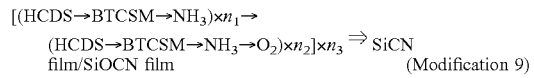 (Modification 9)

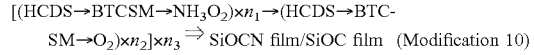 (Modification 10)

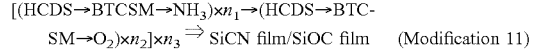 (Modification 11)

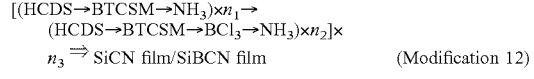 (Modification 12)

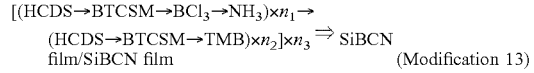 (Modification 13)

(Modification 14)

Figure 9:
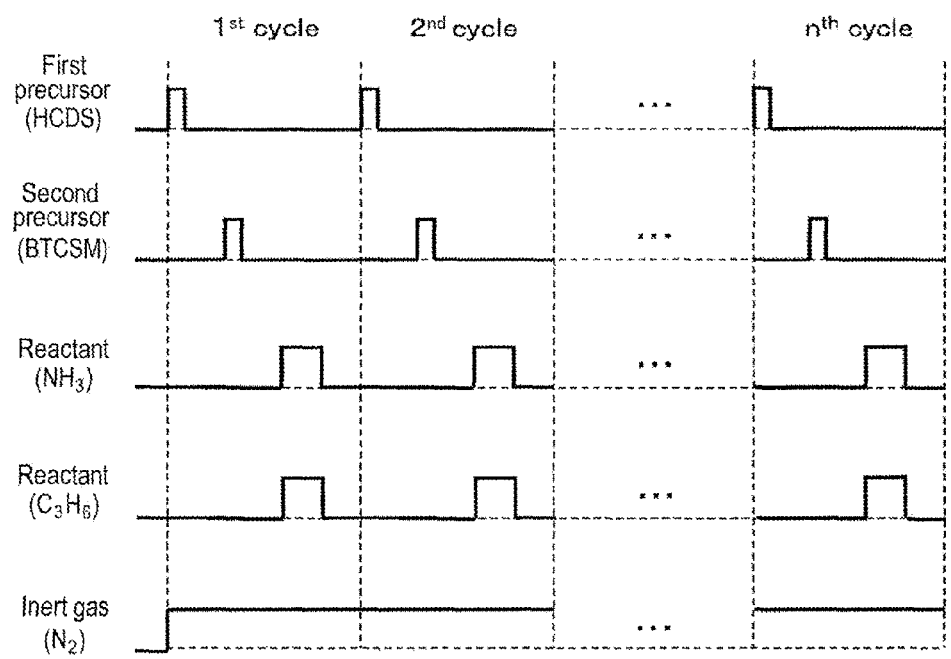
FIG. 9 is a view illustrating gas supply timings in modification 14 of the film forming sequence according to one embodiment of the present disclosure.

In the film fog ling sequence shown in FIG. 4 or in the respective modifications described above, a C-containing gas such as a $C_3H_6$ gas or the like may be supplied simultaneously with a precursor such as a HCDS gas or a BTCSM gas, or a reactant such as a $NH_3$ gas, a $O_2$ gas, a TEA gas, a $BCl_3$ gas or TMB gas. That is to say, a step of supplying a $C_3H_6$ gas may be performed simultaneously with at least one of a step of supplying a precursor and a step of supplying a reactant other than the $C_3H_6$ gas. FIG. 9 illustrates an example in which a step of supplying a $C_3H_6$ gas is performed simultaneously with a step of supplying a $NH_3$ gas, in the film forming sequence shown in FIG. 4.

Even in this modification, it is possible to achieve the effects similar to those of the film forming sequence shown in FIG. 4 and those of the respective modifications described above. Furthermore, according to this modification, it becomes possible to add a C component, which is contained in the $C_3H_6$ gas, to a finally-formed film. This makes it possible to further increase the C concentration in the finally-formed film. However, instead of supplying the $C_3H_6$ gas simultaneously with the HCDS gas or the BTCSM gas, the $C_3H_6$ gas may be supplied simultaneously with the $NH_3$ gas, the $O_2$ gas, the TEA gas, the $BCl_3$ gas or the TMB gas. In this case, it is possible to avoid an excessive gas phase reaction otherwise generated within the process chamber 201 and to suppress generation of particles within the process chamber 201. Furthermore, instead of supplying the $C_3H_6$ gas simultaneously with the $NH_3$ gas, the $O_2$ gas or the $BCl_3$ gas, the $C_3H_6$ gas may be supplied simultaneously with the TMB gas or the TEA gas. In this case, it is possible to further increase the controllability of the composition ratio of the film thus formed. In the case where the $C_3H_6$ gas is supplied simultaneously with the TMB gas or the TEA gas, film formation is performed using three kinds of C sources (triple carbon sources) in one cycle. Thus, it is possible to enable the finally-form film to become a film which is higher in C concentration than the films formed in the film forming sequence shown in FIG. 4 or in the respective modifications described above.

(Modification 15)

Figure 10:
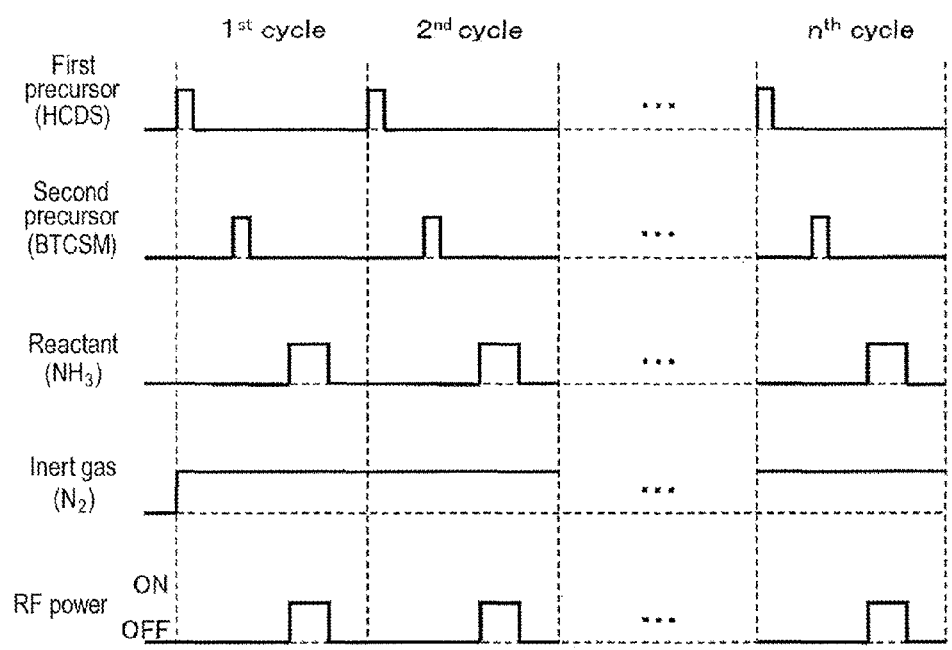
FIG. 10 is a view illustrating gas supply and plasma power supply timings in modification 15 of the film forming sequence according to one embodiment of the present disclosure.

In the film forming sequence shown in FIG. 4 or in the respective modifications described above, a reactant such as a $NH_3$ gas or $O_2$ gas may be supplied by activating the same with plasma. In this case, high-frequency power may be supplied to between the rod-shaped electrodes 269 and 270 when supplying the reactant into the process chamber 201 via the gas supply pipe 232c, the nozzle 249c and the buffer chamber 237. As described above, by forming the first layer as a layer having a low probability of desorption of C, it is possible to suppress desorption of C from the layer even in the case of using a plasma-excited reactant. Thus, it is possible to achieve the effects similar to those of the film forming sequence shown in FIG. 4. FIG. 10 is a view showing the timings of gas supply and plasma power supply in Modification 15.

(Processing Condition)

In the modifications described above, at the step of supplying the TEA gas to the wafer 200, the supply flow rate of the TEA gas controlled by the MFC 241b is set to fall within a range of, e.g., 100 to 10,000 sccm. Other processing conditions may be similar to, e.g., the processing conditions of Step 3 of the film forming sequence shown in FIG. 4. As the N- and C-containing gas, in addition to the TEA gas, it may be possible to use, e.g., an ethylamine-based gas such as a diethylamine ($(C_2H_5)_2NH$, abbreviation: DEA) gas, a monoethylamine ($C_2H_5NH_2$, abbreviation: MEA) gas or the like, and a methylamine-based gas such as a trimethylamine ($(CH_3)_3N$, abbreviation: TMA) gas, a dimethylamine ($(CH_3)_2NH$, abbreviation: DMA) gas, a monomethylamine ($CH_3NH_2$, abbreviation: MMA) gas or the like. Furthermore, as the N- and C-containing gas, in addition to the amine-based gas, it may be possible to use, e.g., an organic hydrazine-based gas. As the organic hydrazine-based gas, it may be possible to use, for example, a methylhydrazine-based gas such as a monomethylhydrazine ($(CH_3)HN_2H_2$, abbreviation: MMH) gas, a dimethylhydrazine ($(CH_3)_2N_2H_2$, abbreviation: DMH) gas, a trimethylhydrazine ($(CH_3)_2N_2(CH_3)H$, abbreviation; TMH) gas or the like, and an ethylhydrazine-based gas such as an ethylhydrazine ($(C_2H_5)HN_2H_2$, abbreviation: EH) gas or the like.

Furthermore, at the step of supplying the $O_2$ gas to the wafer 200, the supply flow rate of the $O_2$ gas controlled by the MFC 241b is set to fall within a range of, e.g., 100 to 10,000 sccm. Other processing conditions may be similar to, e.g., the processing conditions of Step 3 of the film forming sequence shown in FIG. 4. As the O-containing gas, in addition to the $O_2$ gas, it may be possible to use, e.g., a nitrous oxide ($N_2O$) gas, a nitric monoxide (NO) gas, a nitrogen dioxide ($NO_2$) gas, an ozone ($O_3$) gas, a hydrogen ($H_2$)+$O_2$ gas, a $H_2$+$O_3$ gas, a water vapor ($H_2O$), a carbon monoxide (CO) gas, or a carbon dioxide ($CO_2$) gas.

Furthermore, at the step of supplying the $BCl_3$ gas to the wafer 200, the supply flow rate of the $BCl_3$ gas controlled by the MFC 241b is set to fall within a range of, e.g., 100 to 10,000 sccm. Other processing conditions may be similar to, e.g., the processing conditions of Step 3 of the film forming sequence shown in FIG. 4. As the B-containing gas, in addition to the $BCl_3$ gas, it may be possible to use, e.g., a monochloroborane ($BClH_2$) gas, a dichloroborane ($BCl_2H$) gas, a trifluoroborane ($BF_3$) gas, a tribromoborane ($BBr_3$) gas and a diborane ($B_2H_6$) gas.

Furthermore, at the step of supplying the TMB gas to the wafer 200, the supply flow rate of the TMB gas controlled by the MFC 241b is set to fall within a range of, e.g., 1 to 1,000 sccm. Other processing conditions may be similar to, e.g., the processing conditions of Step 3 of the film forming sequence shown in FIG. 4. As the borazine-ring-skeleton-containing and B-containing gas, in addition to the TMB gas, it may be possible to use, e.g., a TEB gas, a TPB gas, a TIPB gas, a TBB gas and a TIBB gas.

Furthermore, at the step of supplying the $C_3H_6$ gas to the wafer 200, the supply flow rate of the $C_3H_6$ gas controlled by the MFC 241c is set to fall within a range of, e.g., 100 to 10,000 sccm. Other processing conditions may be similar to, e.g., the processing conditions of Step 3 of the film forming sequence shown in FIG. 4. As the C-containing gas, in addition to the $C_3H_6$ gas, it may be possible to use, e.g., a hydrocarbon-based gas such as an acetylene ($C_2H_2$) gas or an ethylene ($C_2H_4$) gas.

Furthermore, at the step of supplying the reactant such as a $NH_3$ gas, an $O_2$ gas or the like to the wafer 200 by activating the same with plasma, the supply flow rate of the reactant controlled by the MFC 241b is set to fall within a range of, e.g., 100 to 10,000 sccm. The high-frequency power (RF power) applied to between the rod-shaped electrodes 269 and 270 is set to fall within a range of, e.g., 50 to 1,000 W. The internal pressure of the process chamber 201 is set to fall within a range of, e.g., 1 to 500 Pa, specifically 1 to 100 Pa. The partial pressure of the reactant within the process chamber 201 is set to fall within a range of, e.g., 0.01 to 495 Pa, specifically 0.01 to 99 Pa. By using the plasma, it is possible to activate the reactant even when the internal pressure of the process chamber 201 is set to fall within such a relatively low temperature zone. Other processing conditions may be similar to, e.g., the processing conditions of Step 3 of the film forming sequence shown in FIG. 4.

The processing procedures and the processing conditions at other steps may be similar to the processing procedures and the processing conditions of the respective steps of the film forming sequence shown in FIG. 4.

Other Embodiments of the Present Disclosure

While one embodiment of the present disclosure has been specifically described above, the present disclosure is not limited to the aforementioned embodiment but may be differently modified without departing from the spirit of the present disclosure.

For example, in the aforementioned embodiment, there has been described an example where the reactant is supplied after the supply of the precursor (the first precursor or the second precursor). The present disclosure is not limited thereto. The supply order of the precursor and the reactant may be reversed. That is to say, the precursor may be supplied after the supply of the reactant. By changing the supply order of the precursor and the reactant, it is possible to change the quality or the composition ratio of the thin film thus formed. In the case where plural kinds of reactants are used, the supply order of the reactants may be arbitrarily changed. By changing the supply order of the reactants, it is possible to change the quality or the composition ratio of the thin film thus formed.

If the silicon-based insulating film formed by the methods of the film forming sequence shown in FIG. 4 or the respective modifications described above is used as a sidewall spacer, it is possible to provide a technique of forming a device which is small in leak current and superior in workability. If the aforementioned silicon-based insulating film is used as an etching stopper, it is possible to provide a technique of forming a device which is superior in workability. According to the film forming sequence shown in FIG. 4 or some of the modifications described above, it is possible to form a silicon-based insulating film having an ideal stoichiometric ratio without having to use plasma. Since the silicon-based insulating film can be formed without having to use plasma, it is possible to adapt the present disclosure to a process for forming, e.g., a SADP film of a DPT, in which plasma damage is about a concern.

Even in these cases, the processing conditions may be similar to, e.g., the processing conditions of the aforementioned embodiment.

The aforementioned film forming sequence may be suitably applied to, e.g., a case where a metal-based thin film containing a metal element such as titanium (Ti), zirconium (Zr), hafnium (Hf), tantalum (Ta), niobium (Nb), aluminum (Al), molybdenum (Mo), tungsten (W) or the like is formed.

That is to say, the present disclosure may be suitably applied to, e.g., a case where a metal-based thin film, namely a metal carbide-based film, such as a TiCN film, a TiOCN film, a TiOC film, a TiBCN film, a ZrCN film, a ZrOCN film, a ZrOC film, a ZrBCN film, a HfCN film, a HfOCN film, a HfOC film, a HfBCN film, a TaCN film, a TaOCN film, a TaOC film, a TaBCN film, a NbCN film, a NbOCN film, a NbOC film, a NbBCN film, an AlCN film, an AlOCN film, an AlOC film, an AlBCN film, a MoCN film, a MoOCN film, a MoOC film, a MoBCN film, a WCN film, a WOCN film, a WOC film, a WBCN film, or the like is formed. Furthermore, the present disclosure may be suitably applied to a case where a metal-based nano laminate film composed of the above metal-based thin films alternately laminated at a nano level is formed.

In these cases, a precursor containing a metal element may be used in place of the Si-containing precursor of the aforementioned embodiment. That is to say, as the first precursor, it may be possible to use a metal precursor gas having chemical bonds of metal element. As the second precursor, it may be possible to use a metal precursor gas not having chemical bonds between metal elements and having chemical bonds between metal element and C. As the reactant, it may be possible to use the same reactant as used in the aforementioned embodiment. The processing conditions used at this time may be similar to, e.g., the processing conditions of the aforementioned embodiment.

That is to say, the present disclosure may be suitably applied to a case where a thin film containing a predetermined element such as a semiconductor element, a metal element or the like as a first element, containing a nonmetallic element such as N, O, B or the like as a second element (or a third element), and containing C is formed.

Process recipes (e.g., programs describing processing procedures and processing conditions of a substrate processing process) used in forming these various kinds of films may be prepared individually (in a plural number) according to the contents of a substrate processing process (e.g., the kind, composition ratio, quality, film thickness, processing procedure and processing condition of the film to be formed). In addition, at the start of the substrate processing, an appropriate recipe may be properly selected from the recipes according to the substrate processing contents. Specifically, the recipes individually prepared according to the substrate processing contents may be stored (or installed) in advance in the memory device 121*c* of the substrate processing apparatus via a telecommunication line or a recording medium (e.g., the external memory device 123) storing the recipes. Moreover, at the start of the substrate processing, the CPU 121*a* of the substrate processing apparatus may properly select an appropriate recipe from the recipes stored in the memory device 121*c* according to the substrate processing contents. This configuration enables a single substrate processing apparatus to form films of different kinds, composition ratios, qualities and thicknesses for general purposes and with enhanced reproducibility. In addition, this configuration makes it possible to reduce an operator's operation burden (e.g., a burden borne by an operator when inputting processing procedures and processing conditions) and to quickly start the substrate processing while avoiding an operation error.

The process recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

In the aforementioned embodiment, there has been described an example in which thin films are formed using a batch type substrate processing apparatus capable of processing a plurality of substrates at a time. The present disclosure is not limited to the aforementioned embodiment but may be appropriately applied to, e.g., a case where thin films are formed using a single-wafer-type substrate processing apparatus capable of processing a single substrate or several substrates at a time. In addition, in the aforementioned embodiment, there has been described an example in which thin films are formed using a substrate processing apparatus provided with a hot-wall-type processing furnace. The present disclosure is not limited to the aforementioned embodiment but may be appropriately applied to a case where thin films are formed using a substrate processing apparatus provided with a cold-wall-type processing furnace. In these cases, the processing procedures and the processing conditions may be similar to, e.g., those of the aforementioned embodiment.

Figure 14:
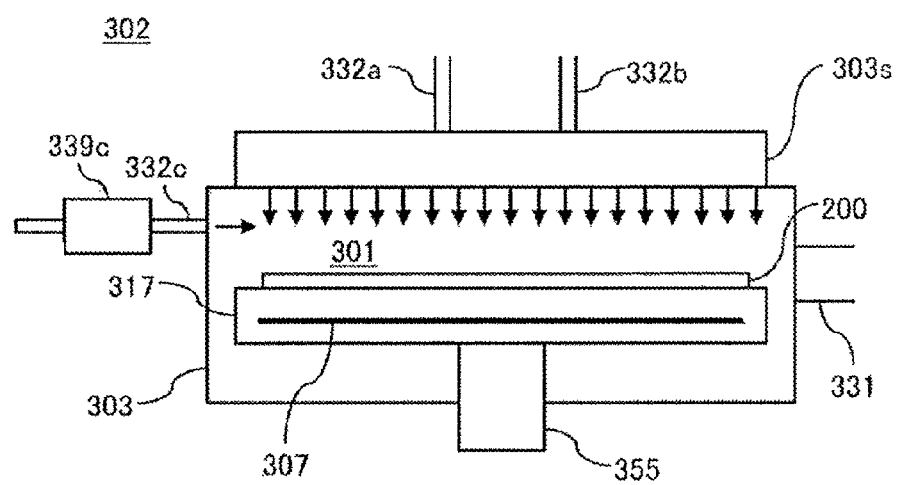
FIG. 14 is a schematic configuration view of a processing furnace of a substrate processing apparatus suitably used in another embodiment of the present disclosure, in which a portion of the processing furnace is shown in a vertical cross section.

The present disclosure may be suitably applied to, e.g., a case where a film is formed using a substrate processing apparatus provided with a processing furnace 302 illustrated in FIG. 14. The processing furnace 302 includes a process vessel 303 which defines a process chamber 301, a shower head 303*s* as a gas supply part configured to supply a gas into the process chamber 301 in a shower-like manner, a support table 317 configured to horizontally support one or more wafers 200, a rotary shaft 355 configured to support the support table 317 from below, and a heater 307 installed in the support table 317. A gas supply port 332*a* configured to supply the aforementioned first precursor and a gas supply port 332*b* configured to the supply the aforementioned second precursor are connected to inlets (gas introduction holes) of the shower head 303*s*. A gas supply port 332*c* as a gas supply part configured to supply the reactant mentioned above is connected to the sidewall of the process vessel 303, namely the lateral side of the end portions of the wafers 200 carried into the process chamber 301. A precursor supply system identical with the first precursor supply system of the aforementioned embodiment is connected to the gas supply port 332*a*. A precursor supply system identical with the second precursor supply system of the aforementioned embodiment is connected to the gas supply port 332*b*. A remote plasma part (or a plasma generating device) 339*c* as an exciting part configured to supply the aforementioned reactant by plasma-exciting the same and a reactant supply system identical with the reactant supply system of the aforementioned embodiment are connected to the gas supply port 332*c*. A gas distribution plate configured to supply a gas into the process chamber 301 in a shower-like manner is installed in outlets (gas discharge holes) of the shower head 303*s*. The shower head 303*s* is installed at such a position as to face the surfaces of the wafers 200 carried into the process chamber 301. The gas supply port 332*c* is formed at such a position as not to face the surfaces of the wafers 200 carried into the process chamber 301. An exhaust port 331 configured to evacuate the interior of the process chamber 301 is installed in the process vessel 303. An exhaust system identical with the exhaust system of the aforementioned embodiment is connected to the exhaust port 331.

Figure 15:
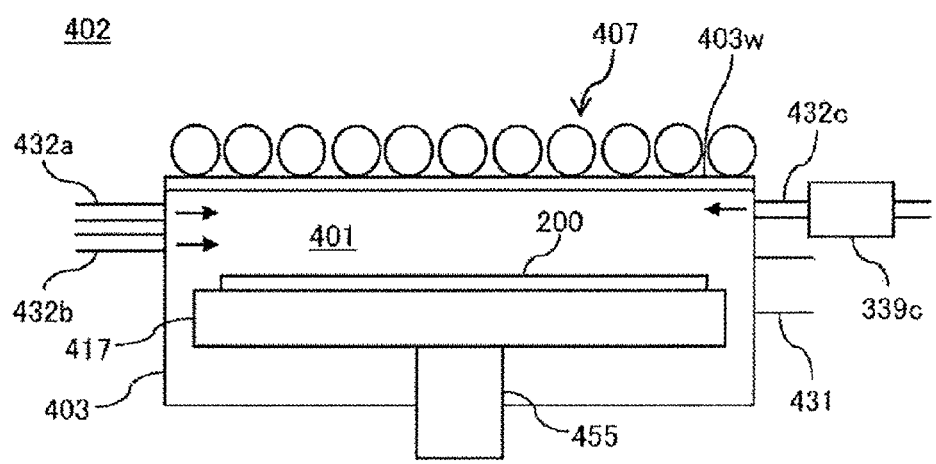
FIG. 15 is a schematic configuration view of a processing furnace of a substrate processing apparatus suitably used in a further embodiment of the present disclosure, in which a portion of the processing furnace is shown in a vertical cross section.

In addition, the present disclosure may be suitably applied to, e.g., a case where a film is formed using a substrate processing apparatus provided with a processing furnace 402 illustrated in FIG. 15. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed within the process vessel 403, and a quartz window 403w which transmits the light irradiated from the lamp heater 407. A gas supply port 432a configured to supply the aforementioned first precursor, a gas supply port 432b configured to supply the aforementioned second precursor and a gas supply port 432c as a gas supply part configured to supply the reactant mentioned above are connected to the process vessel 403. A precursor supply system identical with the first precursor supply system of the aforementioned embodiment is connected to the gas supply port 432a. A precursor supply system identical with the second precursor supply system of the aforementioned embodiment is connected to the gas supply port 432b. The aforementioned remote plasma part 439c and a reactant supply system identical with the reactant supply system of the aforementioned embodiment are connected to the gas supply port 432c. The gas supply ports 432a to 432c are respectively installed at the lateral side of the end portions of the wafers 200 carried into the process chamber 401, namely at such positions as not to face the surfaces of the wafers 200 carried into the process chamber 401. An exhaust port 431 configured to evacuate the interior of the process chamber 401 is installed in the process vessel 403. An exhaust system identical with the exhaust system of the aforementioned embodiment is connected to the exhaust port 431.

In the case of using these substrate processing apparatuses, film formation can be performed by the same sequences and processing conditions as those of the embodiments and modifications described above.

The embodiments and modifications described above may be appropriately combined with one another. In addition, the processing conditions used at this time may be similar to, e.g., the processing conditions of the embodiments described above.

ASPECTS OF THE PRESENT DISCLOSURE

Hereinafter, some aspects of the present disclosure are additionally described as supplementary notes.
(Supplementary Note 1)
According to one aspect of the present disclosure, there are provided a method of manufacturing a semiconductor device and a substrate processing method, including forming a film containing a first element, a second element and carbon on a substrate by performing a cycle a predetermined number of times, the cycle including non-simultaneously performing: supplying a first precursor having chemical bonds between the first elements to a substrate; supplying a second precursor having chemical bonds between the first element and carbon without having the chemical bonds between the first elements to the substrate; and supplying a first reactant containing the second element to the substrate.

(Supplementary Note 2)
In the method of Supplementary Note 1, in the act of supplying the first precursor, a seed layer containing the first element may be formed.
(Supplementary Note 3)
In the method of Supplementary Note 2, in the act of supplying the second precursor, a first layer containing the first element and carbon may be formed on the seed layer.
(Supplementary Note 4)
In the method of Supplementary Note 3, in the act of supplying the first reactant, a second layer containing the first element, the second element and carbon may be formed by modifying the seed layer and the first layer.
(Supplementary Note 5)
In the method of any one of Supplementary Notes 1 to 4, the cycle may be performed the predetermined number of times under a condition in which at least some of the chemical bonds between the first element and carbon contained in the second precursor are maintained.
(Supplementary Note 6)
In the method of Supplementary Note 3, the act of supplying the second precursor may be performed under a condition in which at least some of the chemical bonds between the first element and carbon contained in the second precursor are maintained without being broken. That is to say, in the act of supplying the second precursor, at least some of the chemical bonds between the first element and carbon contained in the second precursor may be introduced into the first layer while maintaining, without breaking, at least some of the chemical bonds between the first element and carbon contained in the second precursor.
(Supplementary Note 7)
In the method of Supplementary Note 4, the act of supplying the reactant may be performed under a condition in which at least some of the chemical bonds between the first element and carbon contained in the first layer are maintained without being broken. That is to say, in the act of supplying the reactant, the seed layer and the first layer may be modified while maintaining, without breaking, at least some of the chemical bonds between the first element and carbon contained in the first layer.
(Supplementary Note 8)
In the method of any one of Supplementary Notes 1 to 7, the cycle may be performed the predetermined number of times under a condition in which the second precursor is pyrolyzed and at least some of the chemical bonds between the first element and carbon contained in the second precursor are maintained.
(Supplementary Note 9)
In the method of any one of Supplementary Notes 1 to 8, a space (process chamber) in which the substrate exists may be purged between the act of supplying the first precursor and the act of supplying the second precursor. That is to say, the first precursor and the second precursor may be kept unmixed in the space in which the substrate exists.
(Supplementary Note 10)
In the method of any one of Supplementary Notes 1 to 9, a supply amount of the first precursor may be set greater than a supply amount of the second precursor.
(Supplementary Note 11)
In the method of any one of Supplementary Notes 1 to 10, a supply flow rate of the first precursor may be set greater than a supply flow rate of the second precursor.
(Supplementary Note 12)
In the method of any one of Supplementary Notes 1 to 11, a supply time of the first precursor may be set longer than a supply time of the second precursor.

(Supplementary Note 13)

In the method of any one of Supplementary Notes 1 to 12, the cycle may further include performing supplying a second reactant containing a third element to the substrate, and the film further containing the third element may be formed on the substrate by performing the cycle the predetermined number of times.

(Supplementary Note 14)

In the method of any one of Supplementary Notes 1 to 13, the first precursor may have the chemical bonds between the first elements and the chemical bonds between the first element and carbon. In this case, in the act of supplying the first precursor, a seed layer containing the first element and carbon may be formed.

(Supplementary Note 15)

In the method of any one of Supplementary Notes 1 to 14, the first precursor may contain the first element, carbon and a halogen element.

(Supplementary Note 16)

In the method of any one of Supplementary Notes 1 to 15, the second precursor may contain the first element, carbon and a halogen element.

(Supplementary Note 17)

In the method of any one of Supplementary Notes 1 to 16, the second precursor may have at least two chemical bonds between the first element and carbon in one molecule (in a chemical structural formula thereof).

(Supplementary Note 18)

In the method of any one of Supplementary Notes 1 to 17, the first reactant may include at least one selected from a group consisting of a nitrogen-containing gas (a nitriding gas or a hydrogen nitride-based gas), a carbon-containing gas (a hydrocarbon-based gas), a nitrogen- and carbon-containing gas (an amine-based gas or an organic hydrazine-based gas), an oxygen-containing gas (an oxidizing gas), a boron-containing gas (a borane-based gas) and a boron-, nitrogen- and carbon-containing gas (a borazine-based gas).

(Supplementary Note 19)

According to another aspect of the present disclosure, there is provided a substrate processing apparatus, including: a process chamber configured to accommodate a substrate; a first precursor supply system configured to supply a first precursor having chemical bonds between the first elements to the substrate in the process chamber; a second precursor supply system configured to supply a second precursor having chemical bonds between a first element and carbon without having the chemical bonds between the first elements to the substrate in the process chamber; a reactant supply system configured to supply a reactant containing a second element to the substrate in the process chamber; and a control part configured to control the first precursor supply system, the second precursor supply system and the reactant supply system so as to perform a process of forming a film containing the first element, the second element and carbon on the substrate by performing a cycle a predetermined number of times, the cycle including non-simultaneously performing: supplying the first precursor to the substrate in the process chamber; supplying the second precursor to the substrate in the process chamber; and supplying the reactant to the substrate in the process chamber.

(Supplementary Note 20)

According to a further aspect of the present disclosure, there is provided a program and a non-transitory computer-readable recording medium storing the program, wherein the program is configured to cause a computer to perform a process of forming a film containing a first element, a second element and carbon on a substrate accommodated in a process chamber by performing a cycle a predetermined number of times, the cycle including non-simultaneously performing: supplying a first precursor having chemical bonds between the first elements to a substrate; supplying a second precursor having chemical bonds between the first element and carbon without the chemical bonds between the first elements to the substrate; and supplying a reactant containing the second element to the substrate.

According to the present disclosure in some embodiments, it is possible to improve the productivity of a film forming process.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising forming a film containing a first element, a second element and carbon on a substrate by performing a cycle a predetermined number of times, the cycle including non-simultaneously performing:

supplying a carbon-free first precursor to the substrate to form a seed layer that has a thickness of one atomic layer or more and contains the first element, wherein the first precursor includes chemical bonds between atoms of the first element;

supplying a second precursor to the substrate to form a first layer containing the first element and carbon on the seed layer, wherein the second precursor includes chemical bonds between the first element and carbon without having the chemical bonds between atoms of the first element, wherein the second precursor contains the first element, carbon and a halogen element; and supplying a first reactant containing the second element to the substrate to modify the seed layer and the first layer into a second layer, wherein the second layer contains the first element, the second element and carbon, wherein a carbon concentration in the second layer is controlled by:

increasing a ratio of the thickness of the seed layer to a thickness of a laminated layer of the seed layer and the first layer so as to decrease the carbon concentration in the second layer; and increasing a ratio of the thickness of the laminated layer of the seed layer and the first layer to the thickness of the seed layer so as to increase the carbon concentration in the second layer.

2. The method of claim 1, wherein the cycle is performed the predetermined number of times under a condition in which at least some of the chemical bonds between the first element and carbon contained in the second precursor are maintained.

3. The method of claim 1, wherein the supplying the second precursor is performed under a condition in which at least some of the chemical bonds between the first element and carbon contained in the second precursor are maintained without being broken.

4. The method of claim 1, wherein the supplying the first reactant is performed under a condition in which at least some of the chemical bonds between the first element and carbon contained in the first layer are maintained without being broken.

5. The method of claim 1, wherein the cycle is performed the predetermined number of times under a condition in which the second precursor is pyrolyzed and at least some of the chemical bonds between the first element and carbon contained in the second precursor are maintained.

6. The method of claim 1, wherein a space in which the substrate exists is purged between the supplying the first precursor and the supplying the second precursor.

7. The method of claim 1, wherein a supply amount of the first precursor is set greater than a supply amount of the second precursor.

8. The method of claim 1, wherein a supply flow rate of the first precursor is set greater than a supply flow rate of the second precursor.

9. The method of claim 1, wherein a supply time of the first precursor is set longer than a supply time of the second precursor.

10. The method of claim 1, wherein the cycle further includes performing supplying a second reactant containing a third element to the substrate, and
the film further containing the third element is formed on the substrate by performing the cycle the predetermined number of times.

11. The method of claim 1, wherein the first precursor contains the first element and a halogen element.

12. The method of claim 1, wherein the second precursor has at least two chemical bonds between the first element and carbon in one molecule.

13. The method of claim 1, wherein the first reactant includes at least one selected from a group consisting of a nitrogen-containing gas, a carbon-containing gas, a nitrogen- and carbon-containing gas, an oxygen-containing gas, a boron-containing gas and a boron-, nitrogen- and carbon-containing gas.

14. A non-transitory computer-readable recording medium storing a program that causes a computer to perform a process of forming a film containing a first element, a second element and carbon on a substrate by performing a cycle a predetermined number of times, the cycle including non-simultaneously performing:
supplying a carbon-free first precursor to the substrate to form a seed layer that has a thickness of one atomic layer or more and contains the first element, wherein the first precursor includes chemical bonds between atoms of the first element;
supplying a second precursor to the substrate to form a first layer containing the first element and carbon on the seed layer, wherein the second precursor includes chemical bonds between the first element and carbon without having the chemical bonds between atoms of the first element; and
supplying a reactant containing the second element to the substrate to modify the seed layer and the first layer into a second layer, wherein the second layer contains the first element, the second element and carbon,
wherein a carbon concentration in the second layer is controlled by:
increasing a ratio of the thickness of the seed layer to a thickness of a laminated layer of the seed layer and the first layer so as to decrease the carbon concentration in the second layer; and
increasing a ratio of the thickness of the laminated layer of the seed layer and the first layer to the thickness of the seed layer so as to increase the carbon concentration in the second layer.

* * * * *